(12) United States Patent
Piestert et al.

(10) Patent No.: US 8,361,701 B2
(45) Date of Patent: Jan. 29, 2013

(54) METHOD FOR MAKING LITHOGRAPHIC PLATES

(75) Inventors: Oliver Piestert, Schwetzingen (DE); Harald Baumann, Osterode/Harz (DE); Ulrich Fiebag, Nienstadt (DE); Bernd Strehmel, Berlin (DE); Uwe Tondock, Osterode (DE); Philip Watkiss, Leeds (GB)

(73) Assignee: Eastman Kodak Company, Rochester, NY (US)

( * ) Notice: Subject to any disclaimer, the term of this patent is extended or adjusted under 35 U.S.C. 154(b) by 356 days.

(21) Appl. No.: 12/677,904

(22) PCT Filed: Sep. 24, 2008

(86) PCT No.: PCT/EP2008/008079
§ 371 (c)(1),
(2), (4) Date: Mar. 12, 2010

(87) PCT Pub. No.: WO2009/040104
PCT Pub. Date: Apr. 2, 2009

(65) Prior Publication Data
US 2010/0304304 A1    Dec. 2, 2010

(30) Foreign Application Priority Data
Sep. 24, 2007    (EP) .................................... 07117078

(51) Int. Cl.
*G03C 5/26* (2006.01)
*B41F 7/00* (2006.01)

(52) U.S. Cl. ...... 430/302; 430/434; 101/453; 101/463.1

(58) Field of Classification Search .................. 430/302, 430/434
See application file for complete search history.

(56) References Cited

U.S. PATENT DOCUMENTS
2005/0266350 A1 * 12/2005 Suzuki et al. ................. 430/300

FOREIGN PATENT DOCUMENTS
| EP | 1 103 859 | 5/2001 |
| WO | 02/31599 | 4/2002 |
| WO | 2006/087102 | 8/2006 |

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

Method for producing an imaged lithographic printing plate comprising the step of developing an imagewise exposed negative working precursor with a developer comprising an alkylene oxide derivative of formula (A), wherein $R^1$ is a linear or branched $C_1$ to $C_6$ alkyl group or H, (n+m) is an integer from 2 to 30, and $R^2$ $R^3$ $R^4$ and $R^5$ are each independently selected from H, methyl and ethyl, with the proviso that at least one of $R^2$ and $R^3$ is not H, and with the further proviso that at least one of $R^4$ and $R^5$ is not H.

(A)

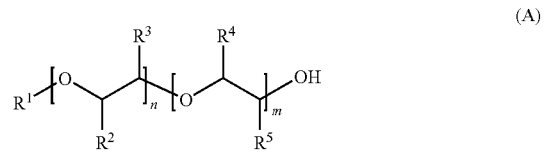

11 Claims, No Drawings

METHOD FOR MAKING LITHOGRAPHIC PLATES

The present invention relates to a method for producing lithographic printing plates from negative working precursors, wherein the developer comprises an alkylene oxide derivative.

Lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source part of which is comprised of UV radiation. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened (for instance by photopolymerization) due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Alternatively, the plate can also be imagewise exposed digitally without a film e.g. by lasers. According to recent developments, plate precursors with heat-sensitive layers are used wherein by imagewise direct heating or irradiation with IR radiation that is converted into heat, differences in the developer solubility of the heated and unheated areas of the coating are generated.

Sometimes water-soluble polymers are used as temporary coatings (sometimes called "overcoat") on lithographic printing plate precursors having an oxygen-sensitive coating like a photopolymerizable coating. The water-soluble polymers have the function of protecting the coating from atmospheric oxygen during storage, exposure and in particular during the time between exposure and further processing (development and the like). During that time period the temporary coating has to exhibit a sufficient adhesion to the light-sensitive substrate so that safe handling (manufacture, packing, transport, exposure etc.) is guaranteed without tearing of the layers. Prior to the development the overcoat can is removed, preferably by washing with water or the overcoat is dissolved within the developer together with the non-image parts.

Usually, a substrate, in particular an aluminum substrate with aluminum oxide layer, is provided with a hydrophilic protective layer (also referred to as "interlayer") before the radiation-sensitive coating is applied. This hydrophilic layer improves the water acceptance of the (non-printing) background areas of a lithographic printing plate and improves the repulsion of the printing ink in these areas. A suitable hydrophilic protective layer also ensures that during developing the soluble portions of the radiation-sensitive layer are removed easily and residue-free from the substrate so that clean background areas are obtained during printing. Without such a residue-free removal, what is referred to as toning would occur during printing, i.e. the background areas would accept printing ink.

For a clean printed image it is necessary that the image areas (i.e. the imagewise remaining coating) accept the printing ink well, while the non-image areas (i.e. the imagewise revealed substrate, such as e.g. an aluminum substrate) should not accept the printing ink. In order to protect the imagewise revealed substrate, such as e.g. an aluminum substrate, against fingerprints, the formation of aluminum oxide, corrosion and mechanical attacks, such as scratches, when the printing plate is mounted in the printing machine, i.e. to maintain and possibly improve the hydrophilic nature of the non-image areas, the developed printing plate is usually subjected to a "gumming" treatment (also referred to as "finishing"). Gumming the plate prior to storing it or before long periods of standstill of the printing machine ensures that the non-image areas remain hydrophilic. When printing is started, the gumming solution has to be able to be washed off the plate quickly with the fountain solution so that the image areas are capable of accepting ink immediately. Gumming solutions have been known for a long time and are for instance disclosed in DE 29 26 645, DE 20 42 217 A1, U.S. Pat. No. 4,880,555 A1, U.S. Pat. No. 4,033,919 A1, and U.S. Pat. No. 4,162,920 A1.

EP 1 199 606 A1 discloses a process for making a negative working lithographic printing plate wherein the developing solution contains an inorganic alkali agent and a nonionic surface active agent having a polyoxyalkylene ether group. It was found that the clean up behavior of a lithographic substrate having high adhesion to hydrophobic coating (e.g. substrate without interlayer) is insufficient and strong toning was observed on press if such developing solution is used.

For removing non-image areas from exposed precursors usually an aqueous alkaline developer solution is used. Developers to be used for positive working precursors commonly differ from developers to be used for negative working precursors, with the exception of a few developers especially developed for both types of precursors. Besides a clean development in the non-image areas within a short time it is also desirable that the remaining image areas (printing areas) are not attacked by the developer solution (i.e. the soak loss of the remaining coating should be low). In addition, the developer should be able to dissolve the removed coating at least to some extend in order to avoid heavy sludge formation in the developing section of a processor. It goes without saying that developers for wet offset plates are usually different from developers for dry offset plates as the coating to be removed differs to a large extend.

EP 1 353 235 A1 discloses a method for making lithographic printing plates. The developer used there contains a nonionic surfactant with polyoxyalkylene ether group, i.e. a surfactant of the formula $R^1-O(R^2-O)_n H$. Due to the fact that the compound is said to be a surfactant it is clear to a person skilled in the art that either $R^1$ is a long chain alkyl group or n is a great integer.

EP 1 457 837 A2 deals with a developing solution for heat-sensitive positive working plate precursors, wherein the developer contains both a linear-type alkylene oxide adduct and a branched-type alkylene oxide adduct. The developer, however, tends to show excessive foaming.

EP 0 043 132 describes a processing liquid for dry planographic printing plate precursors with silicone rubber layer; contains at least 0.1% by weight of a propylene oxide derivative. Due to the silicone rubber the processing liquid mainly comprises an organic solvent like n-hexane and is therefore not a water-based developer. EP 1 038 669 A1 and EP 0 475 384 A1 also deal with processing liquids for dry planographic printing plates.

It is therefore the object of the present invention to provide a process for producing an imaged wet lithographic printing plate from a negative working precursor, wherein there is only low developer soak loss of image parts, however, at the same time there is clean and high speed development of the plate without scumming problems on press. Furthermore, sludge formation in the developing section should be negligible even at high plate loading and low replenishing/top up rates; in addition, foam formation in the developing section and post rinse section of the processor should be avoided.

This object is surprisingly achieved by a method comprising (a) providing a negative working radiation sensitive lithographic plate precursor for wet offset printing comprising on a substrate at least one photosensitive layer based on radical photopolymerization and optionally an oxygen-impermeable overcoat,
(b) imagewise exposing the precursor with radiation having a wavelength from 250 to 1200 nm
(c) developing the exposed precursor with an aqueous alkaline developer comprising:
  (i) at least one alkylene oxide derivate of formula (A)

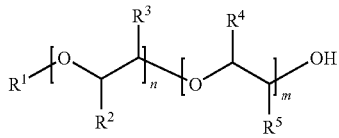

(A)

wherein $R^1$ is a linear or branched $C_1$ to $C_6$ alkyl group or H, n+m is an integer from 2 to 30, and $R^2$, $R^3$, $R^4$ and $R^5$ are each independently selected from H, methyl and ethyl,
  (ii) at least one component selected from alkaline components and surfactants and
  (iii) optionally at least one member of complexing agents, buffers, defoamers, organic solvents, dyes, odorants, biocides, anticorrosive agents, dispersing agents and thickener.

The process of the present invention can be used for processing negative working precursors sensitive to UV, V is or IR radiation.

Precursors

The process of the present invention is suitable for processing negative working precursors for wet offset printing which can be sensitive to UV/Vis radiation or IR radiation. In general, the lithographic printing plate precursor comprises: (i) a substrate, (ii) a radiation-sensitive coating based on radical photopolymerization and (iii) optionally an oxygen-impermeable overcoat.

Examples of suitable precursors are described in the following:

Substrates

The substrate used for the precursors is preferably a dimensionally stable plate or foil-shaped material like one that has already been used as a substrate for printing matter. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the radiation-sensitive coating. Furthermore, a composite film can be used wherein an aluminum foil has been laminated onto a plastic film, such as e.g. a polyethylene terephthalate film, or paper, or a plastic film onto which aluminum has been applied by means of vapor deposition. Preferred substrates are metal substrates, wherein the term "metal substrate" as used herein also encompasses composite films with the upper-most layer being a metal layer or foil.

A metal substrate, in particular an aluminum substrate, is preferably subjected to a surface treatment, for example graining by brushing in a dry state or brushing with abrasive suspensions, or electrochemical graining, e.g. by means of a hydrochloric acid electrolyte or $HNO_3$, and optionally anodizing, e.g. in sulfuric acid or phosphoric acid. According to a preferred embodiment the metal substrate comprises an $Al_2O_3$—, ZnO—, $SiO_2$— or $TiO_2$-layer.

An aluminum foil which preferably has a thickness of 0.1 to 0.7 mm, more preferred 0.15 to 0.5 mm, is an especially preferred substrate. It is preferred that the foil be grained (preferably electrochemically, for instance in hydrochloric acid or nitric acid) and then show an average roughness of 0.2 to 1 μm, especially preferred 0.3 to 0.8 μm.

According to an especially preferred embodiment, the grained aluminum foil was furthermore anodized (for instance in sulphonic acid). The layer weight of the resulting aluminum oxide is preferably 1.5 to 5 g/m², especially preferred 2 to 4 g/m².

A metal substrate can additionally be subjected to a post-treatment (so called "sealing") with an aqueous solution of e.g. alkali metal silicate, calcium zirconium fluoride, hexafluorosilicic acid, phosphate/fluoride, polyvinylphosphonic acid, vinylphosphonic acid copolymers, or phosphonic acid thereby providing a hydrophilizing layer (also referred to as "interlayer") on its surface.

The details of the above-mentioned substrate treatments are well known to the person skilled in the art.

Radiation Sensitive Coating

The negative working coating applied onto a substrate comprises (a) at least one absorber component selected from photoinitiators and sensitizer/coinitiator systems which absorbs radiation of a wavelength in the range of 250 to 1,200 nm and is capable of initiating a free-radical polymerization, (b) a free-radical polymerizable monomer, oligomer and/or prepolymer, and optionally (c) at least one polymeric binder.

Absorber Component

The radiation-sensitive coating furthermore comprises at least one absorber component selected from photoinitiators and sensitizer/coinitiator systems.

The absorber component is selected such that it is capable of significant absorption in the range in which the radiation source to be used later on during imaging emits; preferably, the absorber shows an absorption maximum in that range. Thus, if the radiation-sensitive element is e.g. going to be imaged by means of an IR laser, the absorber should essentially absorb radiation in the range of about 750 to 1,200 nm and preferably show an absorption maximum in that range. On the other hand, if imaging is to be carried out by means of UV/VIS radiation, the absorber should essentially absorb radiation in the range of about 250 to 750 nm and preferably show an absorption maximum in that range. Suitable photoinitiators and/or sensitizers are known to the person skilled in the art, or it can easily be determined whether significant absorption occurs in the desired wave length range by means of simple tests (e.g. recording an absorption spectrum).

In the present invention, a photoinitiator is a compound capable of absorbing radiation when exposed and of forming free radicals by itself, i.e. without the addition of coinitiators. Examples of suitable photoinitiators absorbing UV or VIS radiation include triazine derivatives with 1 to 3 $CX_3$ groups (wherein every X is independently selected from a chlorine or bromine atom, and is preferably a chlorine atom), hexaarylbisimidazole compounds, benzoin ethers, benzil ketals, oxime ethers, oxime esters, α-hydroxy- or α-amino-acetophenones, acylphosphines, acylphosphine oxides, acylphosphine sulfides, metallocenes, peroxides etc. Examples of suitable triazine derivatives include 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, and 2-(4-ethoxy-naphtho-1-yl)-4,6-bis(trichloromethyl)-s-triazine and 2-[4-(2-ethoxyethyl)-naphtho-1-yl]-4,6-bis (trichloromethyl)-s-triazine. Suitable oxime ethers and oxime esters are for example those derived from benzoin. Preferred metallocenes are for example titanocenes with two five-membered cyclodienyl groups such as e.g. cyclopentadienyl groups and one or two six-membered aromatic groups having at least one ortho-fluorine atom and optionally also one pyrryl group; most preferred metallocenes are bis(cyclopentadienyl)-bis-[2,6-difluoro-3-(pyrr-1-yl)-phenyl]titanium and di-cyclopentadiene-bis-2,4,6-trifluorophenyl-titanium or zirconium.

In the present invention, a single photoinitiator or a mixture of two or more can be used.

The photoinitiators can be used alone or in combination with one or more coinitiators; the addition of coinitiators can increase the effectiveness of the photoinitiation.

The amount of photoinitiator(s) is not particularly restricted; however, if photoinitiators are present, it is preferably in the range of 0.2 to 25 wt-%, based on the dry layer weight, especially preferred 0.5 to 15 wt-%.

A sensitizer as referred to in the present invention is a compound which can absorb radiation when it is exposed but which cannot by itself, i.e. without the addition of coinitiators, form free radicals.

All light-absorbing compounds that are photooxidizable or photoreducible or capable of transferring their excitation energy to receptor molecules are suitable sensitizers for use in the present invention. Examples of such dyes include cyanine dyes, merocyanine dyes, oxonol dyes, diarylmethane dyes, triarylmethane dyes, xanthene dyes, coumarin derivatives, ketocoumarin dyes, acridine dyes, phenazine dyes, quinoxaline dyes, pyrrylium dyes or thiapyriylium dyes, azaanulene dyes (such as phthalocyanines and porphyrines), indigo dyes, anthraquinone dyes, polyarylenes, polyarylpolyenes, 2,5-diphenylisobenzofuranes, 2,5-diarylfuranes, 2,5-diarylthiofuranes, 2,5-diarylpyrroles, 2,5-diarylcyclopentadienes, polyarylphenylenes, polyaryl-2-pyrazolines, carbonyl compounds such as aromatic ketones or quinones, e.g. benzophenone derivatives, Michler's ketone, thioxanthone derivatives, anthraquinone derivatives and fluorenone derivatives.

Coumarin sensitizers of formula (I) are for example suitable for the UV range of the electromagnetic spectrum:

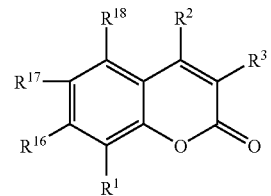

(I)

wherein
$R^1$, $R^{16}$, $R^{17}$ and $R^{18}$ are independently selected from —H, a halogen atom, $C_1$-$C_{20}$ alkyl, —OH, —O—$R^4$ and —NR$^5$R$^6$, wherein $R^4$ is $C_1$-$C_{20}$ alkyl, $C_5$-$C_{10}$ aryl or $C_6$-$C_{30}$ aralkyl (preferably $C_1$-$C_6$ alkyl) and $R^5$ and $R^6$ are independently selected from a hydrogen atom and $C_1$-$C_{20}$ alkyl,
or $R^1$ and $R^{16}$, $R^{16}$ and $R^{17}$ or $R^{17}$ and $R^{18}$ together form a 5- or 6-membered heterocyclic ring with a heteroatom, selected from N and O, in one or both positions adjacent to the phenyl ring shown in formula (I),
or $R^{16}$ or $R^{17}$ forms, together with its two adjacent substituents, a 5- or 6-membered heterocyclic ring with a heteroatom, selected from N and O, in one or both positions adjacent to the phenyl ring shown in formula (I),
wherein each formed 5 or 6-membered heterocyclic ring can independently be substituted with one or more $C_1$-$C_6$ alkyl groups,
with the proviso that at least one of $R^1$, $R^{16}$, $R^{17}$ and $R^{18}$ is different from hydrogen and $C_1$-$C_{20}$ alkyl,
$R^2$ is a hydrogen atom, $C_1$-$C_{20}$ alkyl, $C_5$-$C_{10}$ aryl or $C_6$-$C_{30}$ aralkyl and
$R^3$ is a hydrogen atom or a substituent selected from
—COOH, —COOR$^7$, —COR$^8$, —CONR$^9$R$^{10}$, —CN, $C_5$-$C_{10}$ aryl, $C_6$-$C_{30}$ aralkyl, a 5- or 6-membered heterocyclic optionally benzofused group, a group —CH=CH—R$^{12}$ and

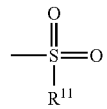

wherein $R^7$ is $C_1$-$C_{20}$ alkyl, $R^8$ is $C_1$-$C_{20}$ alkyl or a 5- or 6-membered heterocyclic group, $R^9$ and $R^{10}$ are independently selected from a hydrogen atom and $C_1$-$C_{20}$ alkyl, $R^{11}$ is $C_1$-$C_{12}$ alkyl or alkenyl, a heterocyclic non-aromatic ring or $C_5$-$C_{20}$ aryl optionally with a heteroatom, selected from O, S and N, and $R^{12}$ is $C_5$-$C_{10}$ aryl or a 5- or 6-membered heterocyclic, optionally aromatic, ring;
or $R^2$ and $R^3$, together with the carbon atoms to which they are bonded, form a 5- or 6-membered, optionally aromatic, ring.

They are described in more detail e.g. in WO 2004/049068 A1.

Furthermore, bisoxazole derivatives and analogues of the formula (II) are suitable for the UV range

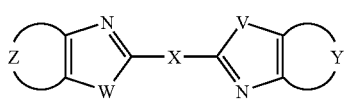
(II)

wherein X is a spacer group comprising at least one C—C double bond conjugated to the heterocycles,
Y and Z independently represent an optionally substituted fused aromatic ring and
V and W are independently selected from O, S and NR, wherein R is an alkyl, aryl or aralkyl group which can optionally be mono- or polysubstituted, as described in more detail in WO 2004/074929 A2, and oxazole compounds of the formula (III)

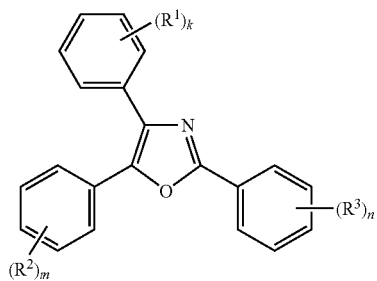
(III)

wherein each $R^1$, $R^2$ and $R^3$ is independently selected from a halogen atom, an optionally substituted alkyl group, an optionally substituted aryl group, which may also be fused, an optionally substituted aralkyl group, a group —$NR^4R^5$ and a group —$OR^6$,
wherein $R^4$ and $R^5$ are independently selected from a hydrogen atom, an alkyl, aryl or aralkyl group,
$R^6$ is an optionally substituted alkyl, aryl or aralkyl group or a hydrogen atom, and k, m and n are independently 0 or an integer from 1 to 5, as described in detail in WO 2004/074930 A2.

The 1,4-dihydropyridine compounds of formula (IV) as described in WO 2004/111731 A1 are an example of another class of sensitizers suitable for the UV range

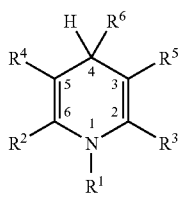
(IV)

wherein
$R^1$ is selected from a hydrogen atom, —C(O)$OR^7$, an optionally substituted alkyl group, an optionally substituted aryl group and an optionally substituted aralkyl group,
$R^2$ and $R^3$ are independently selected from optionally substituted alkyl groups, optionally substituted aryl groups, CN and a hydrogen atom,
$R^4$ and $R^5$ are independently selected from —C(O)$OR^7$, —C(O)$R^7$, —C(O)$NR^8R^9$ and CN,
or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the dihydropyridine ring and wherein the carbocyclic or heterocyclic ring optionally comprises additional substituents,
or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents,
or one of the pairs $R^2/R^4$ and $R^3/R^5$ forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring,
or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —$NR^{13}$ groups, —S— or —O—,
$R^{13}$ is selected from a hydrogen atom, an alkyl group, aryl group and aralkyl group,
$R^6$ is selected from an alkyl group optionally substituted with a halogen atom or a —C(O) group, an optionally substituted aryl group, an optionally substituted aralkyl group, an optionally substituted heterocyclic group and the group

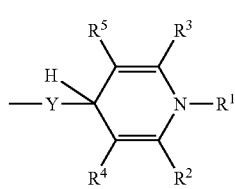

Y is an alkylene or arylene group,
$R^7$ is a hydrogen atom, aryl group, aralkyl group or alkyl group, wherein the alkyl group and the alkyl unit of the aralkyl group optionally comprise one or more C—C double and/or C—C triple bonds,
and $R^8$ and $R^9$ are independently selected from a hydrogen atom, an optionally substituted alkyl group, an optionally substituted aryl group and an optionally substituted aralkyl group.

The sensitizers of formulas (V), (VI), (VII), and (VIII) are also suitable for UV sensitive elements. They are especially suitable for plates imaged by 30 μm (and lower) FM screening (FM=frequency-modulated):

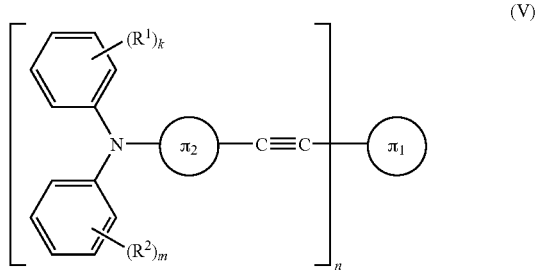
(V)

wherein

and each

independently represent an aromatic or heteroaromatic unit, each $R^1$ and $R^2$ is independently selected from a halogen atom, an alkyl, aryl or aralkyl group, a group —$NR^4R^5$ or a group —$OR^6$,
$R^4$, $R^5$ and $R^6$ are independently selected from an alkyl, aryl and aralkyl group and
n is an integer of at least 2 and
k and m independently represent 0 or an integer from 1 to 5;

wherein

is an aromatic or heteroaromatic unit or a combination of the two so that a conjugated π-system is present between the two groups Z in structure (I),
each Z independently represents a heteroatom connecting the spacer AS and the conjugated system,
each $R^1$ and $R^2$ is independently selected from a halogen atom, an alkyl, aryl, alkylaryl or aralkyl group, a group —$NR^3R^4$ and a group —$OR^5$,
each $R^3$, $R^4$ and $R^5$ is independently selected from an alkyl, aryl, alkylaryl and aralkyl group,
a and b independently represent 0 or an integer from 1 to 4,
n has a value of >1 and
AS is an aliphatic spacer,
(described in more detail in DE 10 2004 055 733);

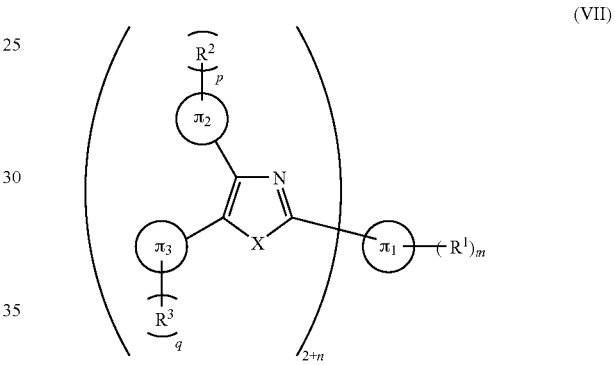
(VII)

wherein
X is selected from O, S and Se;
n represents 0 or a positive integer;
m, p and q are independently 0 or a positive integer;
the π-units

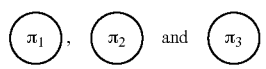

are independently unsaturated units, each with a conjugated π-electron system, which are covalently bonded to the heterocyclic unit

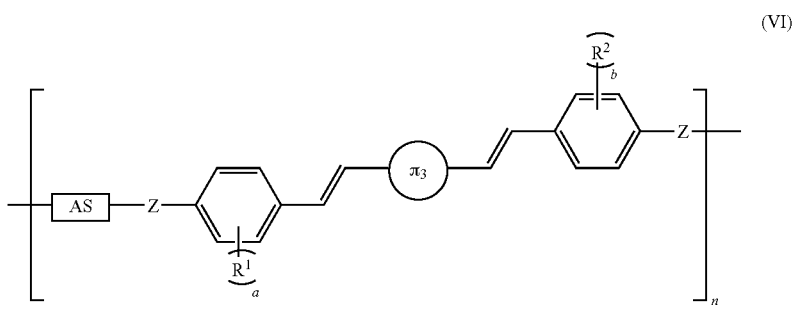
(VI)

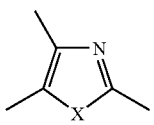

and together with this unit again form a conjugated π-electron system and each group $R^1$, $R^2$ and $R^3$ is independently selected from a hydrogen atom, a halogen atom, an alkyl group, an aralkyl group, a group —$NR^4R^5$ and a group —$OR^6$, wherein $R^4$, $R^5$ and $R^6$ are independently selected from an alkyl group, aryl group and aralkyl group, (described in more detail in DE 10 2004 022 137 B3);

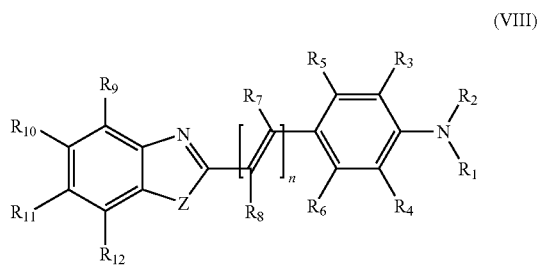

(VIII)

wherein $R_1$ and $R_2$, are independently selected from the group consisting of hydrogen, unsubstituted and substituted aryl, unsubstituted and substituted heteroaryl and unsubstituted and substituted alkyl, said aryl or heteroaryl group being linked to $R_3$ or $R_4$ to form a 5- or 6-membered N-heteroaryl ring or not being linked to $R_3$ and $R_4$; provided that at least one of the groups $R_1$ and $R_2$ is an unsubstituted or substituted aryl or heteroaryl group;

or $R_1$ and $R_2$ together with the nitrogen atom to which they are attached form an N-heteroaryl group which either exhibits one or two fused benzene rings or does not exhibit any fused benzene rings;

$R_3$ and $R_4$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —$SO_2R$, —$SO_3R$, —$NO_2$, $NR_2$, $NR_3^+$, and —$PO_3R_2$, wherein each R is selected from H, alkyl, aryl, aralkyl and alkylaryl, or $R_3$ or $R_4$ are linked to an aryl or heteroaryl group represented by $R_1$ or $R_2$ to form a 5- or 6-membered N-heteroaryl ring;

$R_5$ and $R_6$ are independently selected from the group consisting of hydrogen, CN, halogen, unsubstituted and substituted alkyl, aralkyl, alkylaryl and aryl, —O-alkyl, —O-aryl, —S-alkyl, —COOR, —SOR, —$SO_2R$, —$SO_3R$, —$NO_2$, $NR_2$, $NR_3^+$, and —$PO_3R_2$, wherein each R is selected from the group consisting of H, alkyl, aryl, aralkyl and alkylaryl, or, if $R_3$ and $R_4$ are not linked to $R_1$ and $R_2$, respectively, $R_5$ and $R_3$ and/or $R_6$ and $R_4$ form a 5- or 6-membered fused aromatic ring;

$R_7$ and $R_8$ are independently selected from the group consisting of hydrogen, CN, halogen, and unsubstituted and substituted alkyl, alkylaryl, aralkyl, and aryl;

n is selected from 0, 1 and 2;

Z represents O, S, Se or NR, wherein R is selected from the group consisting of hydrogen, alkyl, aryl, aralkyl and alkylaryl;

$R_9$ to $R_{12}$ are independently selected from the group consisting of hydrogen, halogen, CN, unsubstituted and substituted alkyl, aralkyl, alkylaryl and aryl, —O-alkyl, —O-aryl, —S-alkyl, —COOR, —SOR, —$SO_2R$, —$SO_3R$, —$NO_2$, $NR_2$, $NR_3^+$, and —$PO_3R_2$, wherein each R is selected from the group consisting of H, alkyl, aryl; aralkyl and alkylaryl, provided that at least one of the groups $R_9$ to $R_{12}$ is a bulky group which has a van der Waals volume of at least 55 Å$^3$.

If the radiation-sensitive elements are to be exposed with VIS laser diodes, the cyanopyridone derivatives described in WO 03/069411 A1 are for example suitable as sensitizers.

For IR-sensitive elements, the sensitizers are for example selected from carbon black, phthalocyanine pigments/dyes and pigments/dyes of the polythiophene, squarylium, thiazolium, croconate, merocyanine, cyanine, indolizine, pyrylium or metaldithiolin classes, especially preferred from the cyanine class. The compounds mentioned in Table 1 of U.S. Pat. No. 6,326,122 for example are suitable IR absorbers. Further examples can be found in U.S. Pat. No. 4,327,169, U.S. Pat. No. 4,756,993, U.S. Pat. No. 5,156,938, WO 00/29214, U.S. Pat. No. 6,410,207 and EP 1 176 007 A1.

According to one embodiment, a cyanine dye of formula (IX)

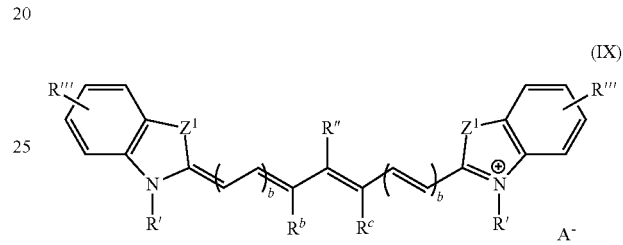

(IX)

is used, wherein each $Z^1$ independently represents S, O, $NR^a$ or C(alkyl)$_2$;

each R' independently represents an alkyl group, an alkylsulfonate group or an alkylammonium group;

R" represents a halogen atom, $SR^a$, $OR^a$, $SO_2R^a$ or $NR^a_2$;

each R'" independently represents a hydrogen atom, an alkyl group, —$COOR^a$, —$OR^a$, —$SR^a$, —$NR^a_2$ or a halogen atom; R'" can also be a benzofused ring;

A⁻ represents an anion;

$R^b$ and $R^c$ either both represent hydrogen atoms or, together with the carbon atoms to which they are attached, form a carbocyclic five- or six-membered ring;

$R^a$ represents a hydrogen atom, an alkyl or aryl group;

each b is independently 0, 1, 2 or 3.

If R' represents an alkylsulfonate group, an internal salt can form so that no anion K is necessary. If R' represents an alkylammonium group, a second counterion is needed which is the same as or different from A⁻.

Of the IR dyes of formula (IX), dyes with a symmetrical structure are especially preferred. Examples of especially preferred dyes include:

2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indolium chloride, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indolium chloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indolium tosylate, 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium tosylate and 2-[2-[2-chloro-3-[2-ethyl-(3H-benzthiazole-2-ylidene)-ethylidene]-1-cyclohexene-1-yl]-ethenyl]-3-ethyl-benzthiazolium tosylate.

The following compounds are also IR absorbers suitable for the present invention:

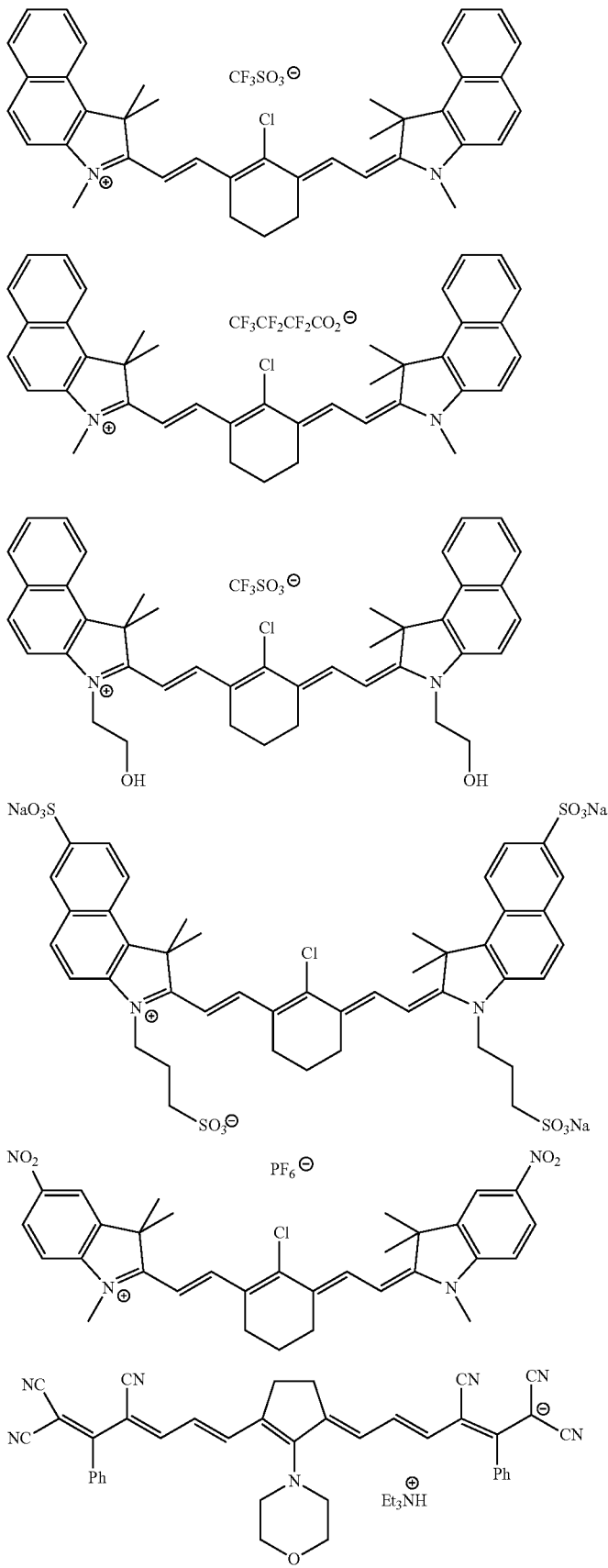

-continued
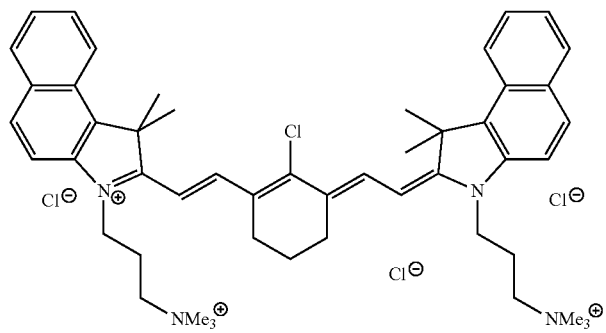
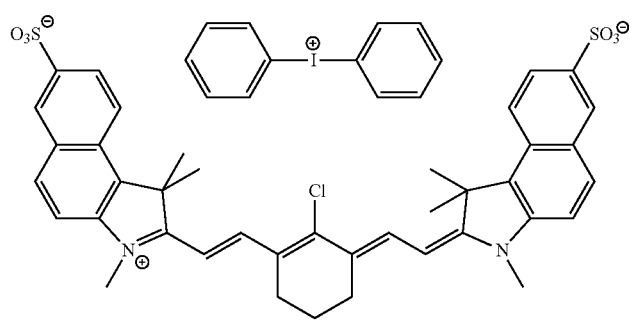
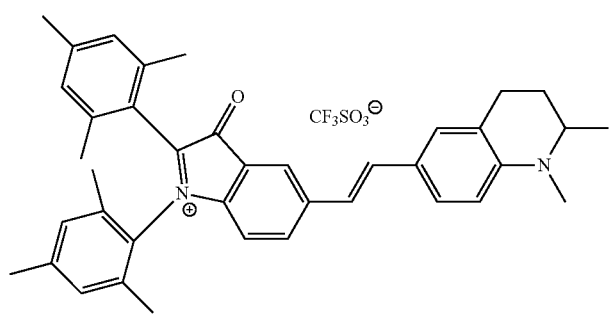
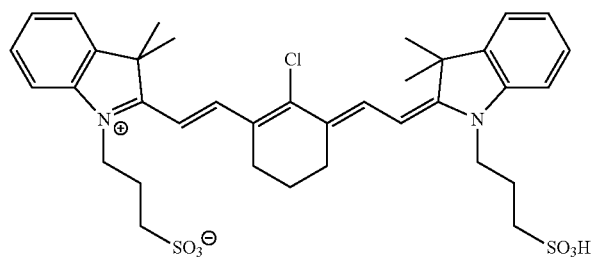
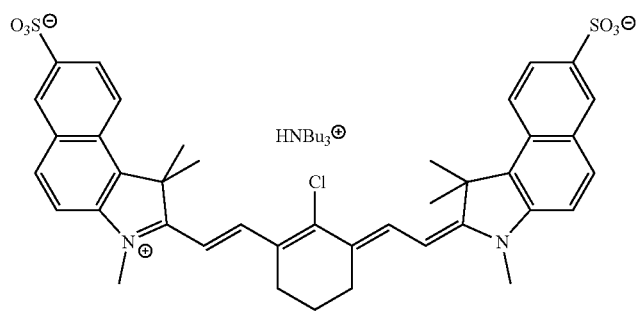

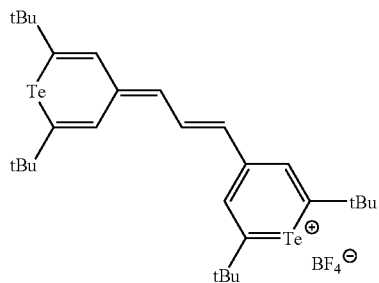
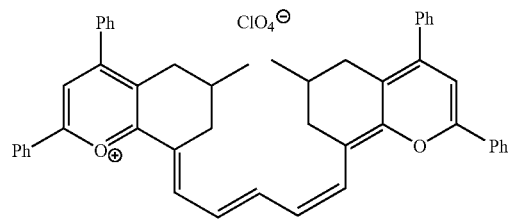
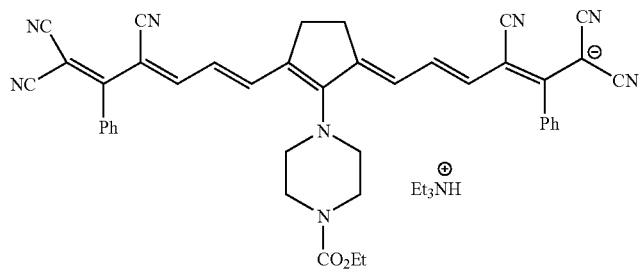
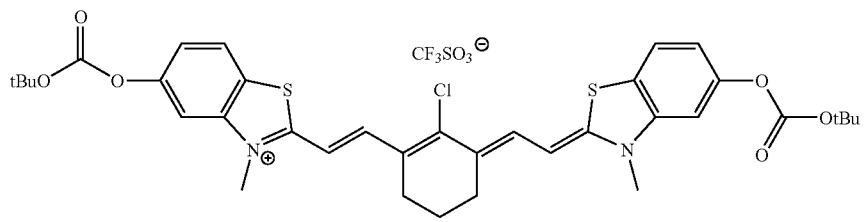
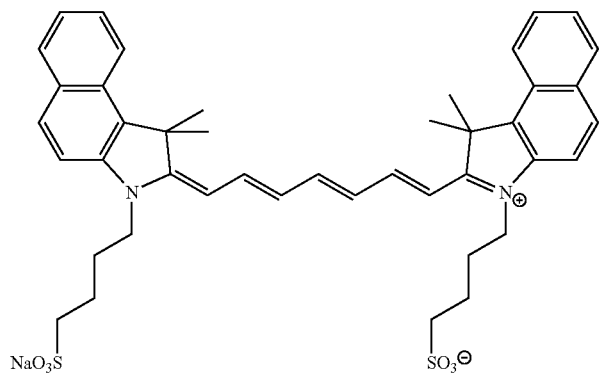
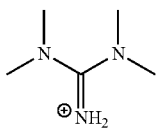
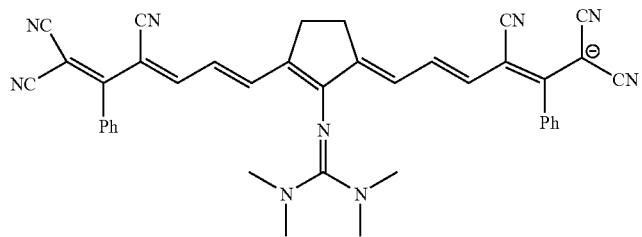

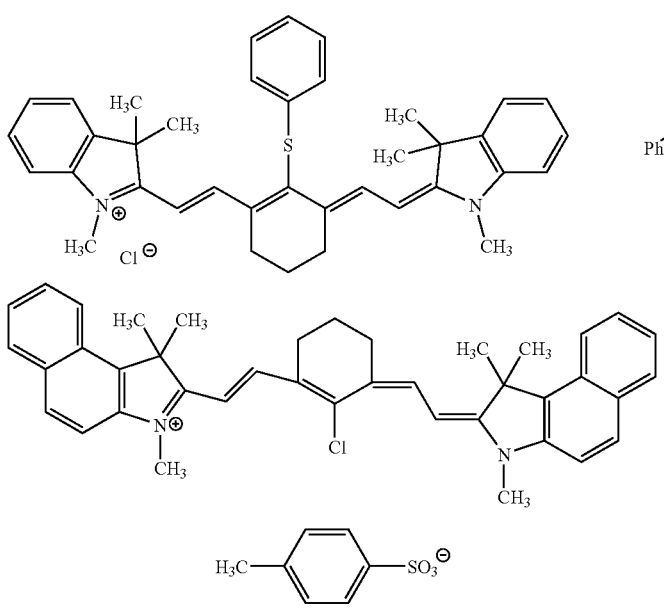

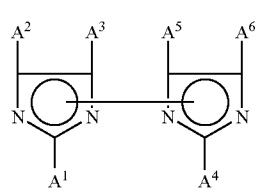

In the present invention, one sensitizer or a mixture of two or more can be used.

The sensitizers are used in combination with one or more coinitiators. Additionally, photoinitiators can be used; however, this is not preferred.

The amount of sensitizer(s) is not particularly restricted; however, if sensitizers are present, it is preferably in the range of 0.2 to 15 wt-%, based on the dry layer weight, especially preferred 0.5 to 10 wt-%. If both photoinitiators and sensitizers are present in the coating, their total amount is preferably 0.5 to 30 wt-%, based on the dry layer weight, especially preferred 1 to 15 wt-%.

A coinitiator as referred to in the present invention is a compound that is essentially unable to absorb when irradiated but forms free radicals together with the radiation-absorbing sensitizers used in the present invention. The coinitiators are for example selected from onium compounds, for example those where the onium cation is selected from iodonium (such as e.g. triaryliodonium salts), sulfonium (such as triarylsulfonium salts), phosphonium, oxylsulfoxonium, oxysulfonium, sulfoxonium, ammonium, diazonium, selenonium, arsenonium and N-substituted N-heterocyclic onium cations wherein N is substituted with an optionally substituted alkyl, alkenyl, alkinyl or aryl; N-arylglycines and derivatives thereof (e.g. N-phenylglycine); aromatic sulfonyl halides; trihalomethylarylsulfones; imides such as N-benzoyloxyphthalimide; diazosulfonates; 9,10-dihydroanthracene derivatives; N-aryl, S-aryl or O-aryl polycarboxylic acids with at least two carboxy groups of which at least one is bonded to the nitrogen, oxygen or sulfur atom of the aryl unit (e.g. aniline diacetic acid and derivatives thereof and other coinitiators described in U.S. Pat. No. 5,629,354); hexaarylbiimidazoles; thiol compounds (e.g. mercaptobenzthiazole, mercaptobenzimidazole and mercaptotriazole); 1,3,5-triazine derivatives with 1 to 3 $CX_3$ groups (wherein every X is independently selected from a chlorine or bromine atom, and is preferably a chlorine atom), such as e.g. 2-phenyl-4,6-bis(trichloromethyl)-s-triazine, 2,4,6-tris(trichloromethyl)-s-triazine, 2-methyl-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis(trichloromethyl)-s-triazine, 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine; oxime ethers and oxime esters, such as for example those derived from benzoin; metallocenes (preferably titanocenes, and especially preferred those with two five-membered cyclodienyl groups, such as e.g. cyclopentadienyl groups and one or two six-membered aromatic groups with at least one ortho fluorine atom and optionally also a pyrryl group, such as bis(cyclopentadienyl)-bis-[2,6-difluoro-3-(pyrr-1-yl)-phenyl]titanium and dicyclopentadiene-bis-2,4,6-trifluorophenyl-titanium or zirconium); acylphosphine oxides, diacylphosphine oxides and peroxides (e.g. those listed in EP-A1-1 035 435 as activators of the type of an organic peroxide), α-hydroxy or α-amino acetophenones, acylphosphines, acylphosphinesulfides, carbonyl compounds such as aromatic ketones or quinones, e.g. benzophenone derivatives, Michler's ketone, thioxanthone derivatives, anthraquinone derivatives and fluorenone derivatives.

Suitable 2,2',4,4',5,5'-hexaarylbiimidazoles (in the following simply referred to as hexaarylbiimidazoles) are represented by the following formula (X):

(X)

$$\begin{array}{c} A^2 \quad A^3 \qquad A^5 \quad A^6 \\ \diagup \quad \diagup \qquad \diagup \quad \diagup \\ N \qquad N \quad N \qquad N \\ \diagdown \qquad \diagup \\ A^1 \qquad A^4 \end{array}$$

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_1$-$C_6$ alkylthio, ($C_1$-$C_6$ alkyl) sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples include:
2,2'-Bis(bromophenyl)-4,4',5,5'-tetraphenylbiimidazole,
2,2'-bis(p-carboxyphenyl)-4,4',5,5'-tetraphenylbiimidazole,
2,2'-bis(o-chlorophenyl)-4,4',5,5'-tetrakis(p-methoxyphenyl)biimidazole,
2,2'-bis(p-chlorophenyl)-4,4',5,5'-tetrakis(p-methoxyphenyl)biimidazole,
2,2'-bis(p-cyanophenyl)-4,4',5,5'-tetrakis(p-methoxyphenyl)biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4.4',5,5'-tetraphenylbiimidazole,
2,2'-bis(o-hexylphenyl)-4,4',5,5'-tetrakis(p-methoxyphenyl)biimidazole,
2,2'-bis(3,4-methylenedioxyphenyl)-4,4',5,5'-tetraphenylbiimidazole,
2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxyethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetraphenylbiimidazole,
2,2'-bis(p-methoxyphenyl)-4,4'-bis(o-methoxyphenyl)-5,5'-diphenylbiimidazole,
2,2'-bis(o-nitrophenyl)-4,4',5,5'-tetraphenylbiimidazole,
2,2'-bis(p-phenylsulfonylphenyl)-4,4',5,5'-tetraphenylbiimidazole,
2,2'-bis(p-sulfamoylphenyl)-4,4',5,5'-tetraphenylbiimidazole,
2,2'-bis(2,4,5-trimethylphenyl)-4,4',5,5'-tetraphenylbiimidazole,
2,2'-di-4-biphenylyl-4,4',5,5'-tetraphenylbiimidazole,
2,2'-di-1-naphthyl-4,4',5,5'-tetrakis(p-methoxyphenyl)biimidazole,
2,2'-di-9-phenanthryl-4,4',5,5'-tetrakis(p-methoxyphenyl)biimidazole,
2,2'-diphenyl-4,4',5,5'-tetra-4-biphenylylbiimidazole,
2,2'-diphenyl-4,4',5,5'-tetra-2,4-xylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-benzylthiophenyebiimidazole,
2,2',4,4',5,5'-hexa-1-naphthylbiimidazole,
2,2',4,4',5,5'-hexaphenylbiimidazole,
2,2'-bis(2-nitro-5-methoxyphenyl)-4,4',5,5'-tetraphenylbiimidazole,
2,2'-bis(o-nitrophenyl)-4,4',5,5'-tetrakis(m-methoxyphenyl)biimidazole, and
2,2'-bis(2-chloro-5-sulfophenyl)-4,4',5,5'-tetraphenylbiimidazole, and especially preferred:
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl)biimidazole,
2,2'-bis(o-chlorophenyl)-4,4',5,5'-tetra(o,p-dibromophenyl)biimidazole,
2,2'-bis(o-bromophenyl)-4,4',5,5'-tetra(o,p-dichlorophenyl)biimidazole or
2,2'-bis(o,p-dichlorophenyl)-4,4',5,5',-tetra(o,p-dichlorophenyl)biimidazole;
but the invention is not restricted to these compounds.

Suitable hexaarylbiimidazoles can be prepared according to known methods (see e.g. U.S. Pat. No. 3,445,232). A preferred process is the oxidative dimerization of corresponding triarylimidazoles with iron-(III)-hexacyanoferrate (II) in an alkali solution.

It is irrelevant for the purposes of the present invention which hexaarylbiimidazole isomer (or mixture of isomers) is used (e.g. 1,2'-, 1,1'-, 1,4', 2,2'-, 2,4'- and 4,4'-isomer), as long as it is photodissociable and provides triarylimidazolyl free radicals in the process.

The trihalogenmethyl compounds suitable as coinitiators are capable of forming free radicals. Trihalogenmethyl-substituted triazines and trihalogenmethyl-arylsulfones are preferred. The following can be mentioned as examples (without restricting the invention to these compounds):
2-(4-Methoxyphenyl)-4,6-bis(trichloromethyl)-s-triazine,
2-(4-chlorophenyl)-4,6-bis-(trichloromethyl)-s-triazine,
2-phenyl-4,6-bis(trichloromethyl)-s-triazine,
2,4,6-tris-(trichloromethyl)-s-triazine,
2,4,6-tris-(tribromomethyl)-s-triazine and
tribromomethylphenylsulfone.

Many coinitiators can also function as photoinitiators when they are exposed to radiation having a wavelength in their absorption band. This way, photosensitive layers can be obtained that are e.g. sensitive over a wide spectral range because a photoinitiator or sensitizer covers the long-wavelength spectral range (IR and/or visible range) and a coinitiator covers the short-wavelength spectral range (e.g. the UV range). This effect can be advantageous if the consumer wants to irradiate the same material with different radiation sources. In this case, the coinitiator functions as an actual coinitiator in the sense of the definition given above for the IR or visible range, while it functions as a photoinitiator for the UV range.

In the present invention, one coinitiator or a mixture of coinitiators can be used.

The amount of coinitiator(s) is not particularly restricted; however, it is preferably in the range of 0.2 to 25 wt-%, based on the dry layer weight, especially preferred 0.5 to 15 wt-%.

Further examples of suitable sensitizers and coinitiators for IR-sensitive coatings are also mentioned in WO 2004/041544, WO 2000/48836 and DE 10 2004 003143.

Free-Radical Polymerizable Component

All monomers, oligomers and polymers which comprise at least one C—C double bond can be used as free-radical polymerizable monomers, oligomers and polymers. Monomers/ oligomers/polymers with C—C triple bonds can also be used, but they are not preferred. Suitable compounds are well known to the person skilled in the art and can be used in the present invention without any particular limitations. Esters of acrylic and methacrylic acids, itaconic acid, crotonic and isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and trimethacrylate, pentaerythritol triacrylate and trimethacrylate, dipentaerythritolmonohydroxy pentaacrylate and pentamethacrylate, dipentaerythritol hexaacrylate and hexamethacrylate, pentaerythritol tetraacrylate and tetramethacrylate, ditrimethylol propane tetraacrylate and tetramethacrylate, diethyleneglycol diacrylate and dimethacrylate, triethyleneglycol diacrylate and dimethacrylate or tetraethyleneglycol diacrylate and dimethacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride copolymers and hydroxyalkyl(meth)acrylates (cf. e.g. DE 4 311 738 C1); (meth)acrylic acid polymers, partially or fully esterified with allyl alcohol (cf. e.g. DE 3 332 640 A1); reaction products of polymeric polyalcohols and isocyanatoalkyl(meth)acrylates; unsaturated polyesters; (meth)acrylate-terminated polystyrenes, poly(meth)acrylic acid ester, poly(meth)acrylic acids, poly(meth)acrylamides; (meth) acrylic acid polymers, partially or fully esterified with epoxides comprising free-radical polymerizable groups; and polymers with allyl side-groups which can for example be obtained by polymerization of allyl(meth)acrylate, optionally with further comonomers.

Free-radical polymerizable compounds that can be used in the present invention also include compounds that have a molecular weight of 3,000 or less and are reaction products obtained by reacting a diisocyanate with (i) an ethylenically unsaturated compound with one hydroxy group, and at the same time (ii) a saturated organic compound with one NH group and one OH group, wherein the reactants are used in amounts according to the following condition:

Number of moles of isocyanate groups<number of moles of OH plus NH groups.

Examples of diisocyanates are represented by the following formula:

$$O=C=N-(CR^9_2)_a\text{-}D\text{-}(CR^9_2)_b-N=C=O \qquad (XI)$$

wherein a and b independently represent 0 or an integer from 1 to 3, each $R^9$ is independently selected from H and $C_1$-$C_3$ alkyl and D is a saturated or unsaturated spacer which can optionally comprise further substituents in addition to the two isocyanate groups. D can be a chain-shaped or a ring-shaped unit. As used in the present invention, the term "diisocyanate" refers to an organic compound comprising two isocyanate groups but no OH groups and no secondary and primary amino groups.

D can for example be an alkylene group $(CH_2)_w$, wherein w is an integer from 1 to 12, preferably 1 to 6, and one or more hydrogen atoms are optionally replaced with substituents such as e.g. alkyl groups (preferably $C_1$-$C_6$), a cycloalkylene group, an arylene group or a saturated or unsaturated heterocyclic group.

The ethylenically unsaturated compound (i), which comprises a hydroxy group, comprises at least one non-aromatic C—C double bond, which is preferably terminal. The hydroxy group is preferably not bonded to a doubly bonded carbon atom; the hydroxy group is not part of a carboxy group. In addition to the one OH group, the ethylenically unsaturated compound (i) does not comprise any further functional groups, such as e.g. NH, which can react with the isocyanate.

Examples of the ethylenically unsaturated compound (i) include

Hydroxy($C_1$-$C_{12}$)alkyl(meth)acrylates (e.g. 2-hydroxyethyl(meth)acrylate, 2- or 3-hydroxy-propyl(meth)acrylate, 2-, 3- or 4-hydroxybutyl(meth)acrylate), hydroxy($C_1$-$C_{12}$) alkyl-(meth)acrylamides (e.g. 2-hydroxyethyl(meth)acrylamide, 2- or 3-hydroxypropyl(meth)-acrylamide, 2-, 3- or 4-hydroxybutyl(meth)acrylamide), mono(meth)acrylates of oligomeric or polymeric ethylene glycols or propylene glycols (e.g. polyethylene glycol mono(meth)acrylate, triethylene glycol mono(meth)acrylate), allyl alcohol, pentaerythritol tri(meth)acrylate, 4-hydroxy($C_1$-$C_{12}$)alkylstyrene (e.g. 4-hydroxymethylstyrene), 4-hydroxystyrene, hydroxycyclohexyl(meth)acrylate.

The term "(meth)acrylate" as used in the present invention indicates that both methacrylate and acrylate etc. are meant.

The saturated organic compound (ii) is a compound with one OH and one NH group.

The saturated organic compound (ii) can for example be represented by the following formula (XII) or (XIII)

$$R^{10}-N-E-OH \qquad (XII)$$
$$\phantom{R^{10}-N-E-}\,\,H$$

(XIII)

wherein $R^{10}$ is a straight-chain (preferably $C_1$-$C_{12}$, especially preferred $C_1$-$C_4$), branched (preferably $C_3$-$C_{12}$, especially preferred $C_3$-$C_6$) or cyclic (preferably $C_3$-$C_8$, especially preferred $C_5$-$C_6$) alkyl group, E is a straight-chain (preferably $C_1$-$C_6$, especially preferred $C_1$-$C_2$), branched (preferably $C_3$-$C_{12}$, especially preferred $C_3$-$C_6$) or cyclic (preferably $C_3$-$C_8$, especially preferred $C_5$-$C_6$) alkylene group,

represents a saturated heterocyclic ring with 5 to 7 ring atoms, which in addition to the nitrogen atom shown above optionally comprises another heteroatom selected from S, O and $NR^{12}$, wherein $R^{12}$ is an alkyl group optionally substituted with an OH group, $R^{11}$ is OH or a straight-chain, branched or cyclic alkyl group substituted with an OH group, and z=0 if the heterocyclic ring comprises $NR^{12}$ and $R^{12}$ is an alkyl group substituted with OH and z=1 if the saturated heterocyclic ring does not comprise NR$^{12}$ or if the saturated heterocyclic ring comprises NR$^{12}$ and R$^{12}$ is an unsubstituted alkyl group.

The number of moles of isocyanate groups must not exceed the number of moles of OH groups and NH groups combined since the product should not comprise any more free isocyanate groups.

Additional suitable C—C unsaturated free-radical polymerizable compounds are described e.g. in EP 1 176 007 A2.

It is of course possible to use different kinds of monomers, oligomers or polymers in admixture; furthermore, mixtures of monomers and oligomers and/or polymers can be used in the present invention, as well as mixtures of oligomers and polymers.

The free-radical polymerizable component is preferably used in an amount of 5 to 95 wt-%, based on the dry layer weight, especially preferred 10 to 85 wt-%.

Binders

Suitable binders are polymers/copolymers soluble or dispersible in aqueous alkaline developer, such as e.g. phenolic resins such as novolaks and resols, and copolymers of (meth)acrylic acid, N-phenylmaleimide and (meth)acrylamide (see DE 199 36 331).

Further suitable binders are "reactive binders", i.e. polymeric binders having side chains comprising free radical polymerizable groups. For example the reactive side groups are selected from acryl, methacryl, styryl, allyl, and mixtures of two or more thereof. The polymer backbone is not limited and is for example selected from an acrylic backbone, methacrylic backbone, acetal backbone, urethane backbone, and styrene backbone; copolymers of the aforementioned are also possible. Suitable reactive binders are disclosed in a number of patent applications e.g. WO 2004/014652 A1, WO 89/06659 A1, DE 29 03 270 A1, WO 95/12147, EP 410 242, and U.S. Pat. No. 4,035,321.

The total amount of binders is preferably 5 to 95 wt-%, based on the dry layer weight, especially preferred 10 to 85 wt-%.

Optional Components

Independently of whether the element is UV/VIS- or IR-sensitive, the radiation-sensitive coating can comprise one or more of the following optional components in addition to the essential components. If the coating consists of several layers, the optional component(s) can be present in one, several or all of the layers. Dyes or pigments having a high absorption in the visible spectral range can be present in order to increase the contrast ("contrast dyes and pigments"). Particularly suitable dyes and pigments are those that dissolve well in the solvent or solvent mixture used for coating or are easily introduced in the disperse form of a pigment. Suitable contrast dyes include inter alia rhodamine dyes, triarylmethane dyes such as Victoria blue R and Victoria blue BO, crystal violet and methyl violet, anthraquinone pigments, azo pigments and phthalocyanine dyes and/or pigments. The colorants are preferably present in an amount of 0 to 15 wt-%, more preferred 0.5 to 10 wt-%, particularly preferred 1.5 to 7 wt-%, based on the dry layer weight.

Furthermore, the layer(s) can comprise surfactants (e.g. anionic, cationic, amphoteric or non-ionic tensides or mixtures thereof). Suitable examples include fluorine-containing polymers, polymers with ethylene oxide and/or propylene oxide groups, sorbitol-tri-stearate and alkyl-di-(aminoethyl)-glycines. They are preferably present in an amount of 0 to 10 wt-%, based on the dry layer weight, especially preferred 0.2 to 5 wt-%.

The layer(s) can furthermore comprise print-out dyes such as crystal violet lactone or photochromic dyes (e.g. spiropyrans etc.). They are preferably present in an amount of 0 to 15 wt-%, based on the dry layer weight, especially preferred 0.5 to 5 wt-%.

Also, flow improvers can be present in the layer(s), such as poly(glycol)ether-modified siloxanes; they are preferably present in an amount of 0 to 1 wt-%, based on the dry layer weight.

The layer(s) can furthermore comprise antioxidants such as e.g. mercapto compounds (2-mercapto-benzimidazole, 2-mercaptobenzthiazole, 2-mercaptobenzoxazole and 3-mercapto-1,2,4-triazole), and triphenylphosphate. They are preferably used in an amount of 0 to 15 wt-%, based on the dry layer weight, especially preferred 0.5 to 5 wt-%.

Overcoat

An oxygen-impermeable overcoat can be applied over the photopolymerizable coating; "oxygen-impermeable" does not necessarily mean "impermeable to 100%" but sufficient for protecting the coating from atmospheric oxygen during storage, exposure and in particular during the time between exposure and further processing. During that time the overcoat has to exhibit sufficient adhesion to the light-sensitive coating so that safe handling (manufacture, packing, transport, exposure etc.) is guaranteed without tearing of the layers. In addition to its function as oxygen barrier layer the overcoat also protects the photopolymerizable coating from fingerprints and mechanical damage like scratches.

A number of water-soluble polymers are described in the literature as being suitable for such overcoats. Suitable examples are polyvinyl alcohol, partly saponified polyvinyl acetate which can also contain vinylether and vinylacetal units, polyvinyl pyrrolidone and copolymers thereof with vinyl acetate and vinyl ethers, hydroxy alkyl cellulose, gelatin, polyacrylic acid, gum arabic, polyacryl amide, dextrin, cyclodextrin, copolymers of alkylvinyl ethers and maleic acid anhydride as well as water-soluble high molecular polymers of ethylene oxide having molecular weights of above 5,000 are particularly suitable. Polyvinyl alcohol is a preferred overcoat polymer. Also polyvinyl alcohol in combination with poly(1-vinylimidazole) or a copolymer of 1-vinyl-imidazole and at least one further monomer as described in WO 99/06890 can be used.

Polyvinyl alcohol can also be used in combination with polyvinyl pyrrolidone as adhesive.

Overcoats are also described in U.S. Pat. No. 3,458,311, U.S. Pat. No. 4,072,527, U.S. Pat. No. 4,072,528, EP 275 147 A1, EP 403 096 A1, EP 354 475 A1, EP 465 034 A1 and EP 352 630 A1.

In a preferred embodiment the overcoat comprises polyvinyl alcohol or polyvinyl alcohol in combination with poly(1-vinylimidazol) (or a copolymer thereof).

Suitable polyvinyl alcohols are commercially available at inexpensive prices. They usually have a residual content of acetate groups in the range of 0.1 to 30 wt-%. Especially preferred are polyvinyl alcohols obtained from polyvinylacetate with a residual acetate content of 1.5 to 22 wt-%. By means of the molecular weight of the used polyvinyl alcohols, adhesion and water-solubility of the overcoats can be controlled. A lower molecular weight promotes the removal of the overcoat with aqueous solutions.

The water-soluble overcoats can be applied by means of surface coating methods known to the skilled practian such as doctor blade coating, roller coating, slot coating, curtain coating, spray or dipping processes. Dry layer weights of from 0.05 to 10 g/m², more preferably 0.2 to 3 g/m², most preferably 0.3 to 1 g/m² are suitable.

In many cases it is favorable to apply the water-soluble overcoats in an aqueous solution. This has the least detrimental effects on the environment and the human body.

For some applications, however, it can also be favorable to use organic solvents. In case of some substrates the addition of 0.5 to 60 wt-% of an organic solvent to the aqueous coating solution improves adhesion. By means of a slight solvation of the surface to be overcoated, the adhesive effect of the polymers of the overcoats according to the present invention is increased further. Such additives to solvents can e.g. be alcohols or ketones.

For a uniform and rapid wetting of the surface to be coated, anionic, cationic or non-ionic wetting agents may be added to the coating solutions. The overcoat furthermore can comprise stabilizers, preservatives, dyeing agents, foam separators and rheological additives.

Imagewise Exposure

If the absorber component used in the photopolymerizable coating absorbs UV/VIS radiation, the precursors are imagewise exposed in a manner known to the person skilled in the art with UV/VIS radiation of a wavelength of 250 to 750 nm. For this purpose, common lamps, such as carbon arc lamps, mercury lamps, xenon lamps and metal halide lamps, or lasers or laser diodes can be used. UV laser diodes emitting UV radiation in the range of about 405 nm (e.g. 405±10 nm), argon ion lasers emitting in the visible range (488 nm or 514 nm) and frequency-doubled fd:Nd:YAG lasers emitting at around 532 nm are of particular interest as a radiation source. The laser radiation can be digitally controlled via a computer, i.e. it can be turned on or off so that an imagewise exposure of the plates can be effected via stored digitized information in the computer; this way, so-called computer-to-plate (ctp) printing plates can be obtained.

If the absorber component absorbs IR radiation, i.e. noticeably absorbs radiation of a wavelength in the range of more than 750 to 1,200 nm, and preferably shows an absorption maximum in this range in its absorption spectrum, imagewise exposure can be carried out with IR radiation sources. Suitable radiation sources are e.g. semi-conductor lasers or laser diodes which emit in the range of 750 to 1200 nm, for example Nd:YAG lasers (1,064 nm), laser diodes which emit between 790 and 990 nm, and Ti:sapphire lasers. The laser radiation can be digitally controlled via a computer, i.e. it can be turned on or off so that an imagewise exposure of the plates can be effected via stored digitized information in the computer; this way, so-called computer-to-plate (ctp) printing plates can be obtained. Any image-setters equipped with IR lasers that are known to the person skilled in the art can be used.

The imagewise exposed precuror comprises exposed and unexposed areas of the coating.

Processing of the Exposed Precursor

After imagewise exposure the precursor is treated with the developer in order to remove the coating in the non-image areas thereby revealing the substrate in said areas; if the precursor was a positive working one, the non-image areas correspond to the exposed areas while for negative working precursors the non-image areas correspond to the unexposed areas. According to one embodiment a preheat step is carried out between exposure and treating with the developer.

If the precursor comprises an overcoat which protects the radiation sensitive coating, the overcoat can be removed by washing/rinsing with water before applying the developer. According to one embodiment the overcoat is not removed in a separate step but is removed together with the non-image areas of the radiation sensitive coating in a single step by treating the exposed precursor with the developer according to the present invention.

After removing the non-image areas of the coating (and optionally the overcoat) with the developer, the treated precursor can be dried.

According to another embodiment after removing the non-image areas of the coating (and optionally the overcoat) with the developer, the treated precursor can be rinsed with water.

According to a further embodiment after removing the non-image areas of the coating (and optionally the overcoat) with the developer and rinsing the precursor with water application of a hydrophilic finishing gum is possible.

Typically, the exposed precursor is contacted with the developer by rubbing or wiping the imageable layer with an applicator containing this liquid. Alternatively, the exposed precursor may be brushed with the developer or the developer may be applied to the precursor by spraying. The treatment with the developer can also be carried out by immersing the exposed precursor in a bath of the developer. According to one embodiment, the processing may be carried out in a commercially available processor, such as TDP 60 (Horsell) which contains only one bath for the developer and a drying section. Additionally, a conductivity-measuring unit can be incorporated into the processor.

According to another embodiment, conventional processors equipped with an immersion type developing bath, a section for rinsing with water, a gumming section, and a drying section, can be used. Additionally, a conductivity-measuring unit can be incorporated into the processor for controlling the developer activity of the developer.

The exposed precursor is typically treated with the developer at a temperature of 15° C. to about 45° C. (preferably 20 to 32° C.), for a period of about 5 seconds to about 60 seconds.

After a certain number of exposed precursors have been processed, the developing activity (for instance measured by titration or conductivity measurement) of a developer bath falls below a predetermined level. Then fresh developer is added to the bath (also called "top-up" process). Usually about 15 mL to about 300 mL, typically about 25-150 mL, of fresh developer per 1 m² of precursor processed is necessary to keep both the volume of developer and its activity/conductivity value constant. The processed lithographic printing plate, comprises regions in which imageable layer has been removed revealing the underlying surface of the hydrophilic substrate, and complimentary regions in which the imageable layer has not been removed. The regions in which the imageable layer has not been removed are ink receptive.

Instead of adding fresh developer for keeping the activity of the developer bath constant a replenisher can be added. The replenisher suitably differs from the fresh developer in that the concentration of the alkaline reagent is higher compared to the concentration of the alkaline reagent in the fresh developer used; the concentration of the other components might be the same or higher as in the fresh developer. The amount of replenisher required to be added is the same as for the top-up process, i.e. about 15 to 300 mL per 1 m² processed precursor.

After having contacted the precursor with the developer any excess of said developer remaining on the precursor is removed (for instance by means of squeeze rollers; washing/rinsing the precursor with a liquid like water etc. After a subsequent optional drying step the processed precursor can be transferred to the press. On the press the processed precursor is contacted with fountain solution and printing ink, either simultaneously or subsequently (in any order, but preferably first fountain solution and thereafter ink). By contacting the precursor with the fountain solution and ink and thereafter with paper any remainders of undesired coating (radiation-sensitive coating in the non-image areas and/or overcoat) which have not already been removed by the treatment with the developer are removed.

Developer

The developer used in the method of the present invention is an aqueous alkaline solution preferably having a pH value of 8 to 13, more preferably a pH of from 9 to 12.

Water

Tap water, deionized water or distilled water can be used. The amount of water is preferably in the range of 45 to 98 wt-%, based on the total weight of the developer, especially preferred 50 to 95 wt-% and particularly preferred 75 to 95 wt-%.

Alkylene Oxide Derivative

The developer used in the method of the present invention comprises at least one alkylene oxide derivative of formula (A)

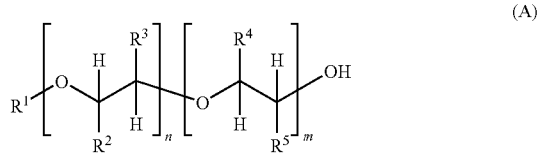

wherein $R^1$ is a linear or branched $C_1$-$C_6$ alkyl group or H, (n+m) is an integer from 2 to 30, $R^2$, $R^3$, $R^4$ and $R^5$ are independently selected from H, —$CH_3$ and —$CH_2$—$CH_3$, with the proviso that at least one of $R^2$ and $R^3$ is not H, and with the further proviso that at least one of $R^4$ and $R^5$ is not H.

Preferably $R^1$ is a $C_1$-$C_4$ alkyl group or H, more preferably H or $C_1$-$C_2$ (n+m) is preferably an integer from 2 to 20, more preferably 2 to 9.

Preferably $R^2$=$R^4$ and/or $R^3$=$R^5$.

Preferably $R^2$, $R^3$, $R^4$ and $R^5$ are independently selected from H and —$CH_3$, with the proviso that at least one of $R^2$ and $R^3$, and at least one of $R^4$ and $R^5$ is not H.

Especially preferred alkylene oxide derivatives are: polypropylene oxide (with such a molecular weight that (n+m)=2 to 30, preferably 2 to 9), dipropylene glycol methyl ether, dipropylene glycol n-propyl ether, dipropylene glycol n-butyl ether, dipropylene glycol, tripropylene glycol methyl ether, tripropylene glycol n-butyl ether, tripropylene glycol monoethyl ether, and tripropylene glycol.

The amount of the alkylene oxide derivative is preferably in the range of 0.001 to 50 wt.-%, more preferably 0.01 to 25 wt.-%.

Alkaline Component

The developer used in the present invention optionally comprises an alkaline component.

The alkaline component can for instance be selected from alkali silicates, alkali hydroxides, $Na_3PO_4$, $K_3PO_4$, $NR_4OH$, wherein each R is independently selected from $C_1$-$C_4$ alkyl groups and $C_1$-$C_4$ hydroxyalkyl groups, amines and mixtures of 2 or more of the foregoing.

The amount of the alkaline component, or in case of mixtures the total amount of the alkaline components, is preferably selected such that the pH value of the developer is 8 to 13, more preferably the pH is in the range of 9 to 12.

As used in the present invention, the term "alkali silicates" also encompasses metasilicates and water glasses. Sodium silicates and potassium silicates are preferred silicates. When alkali silicates are used, the amount of silicate is preferably at least 1 wt-% (calculated as $SiO_2$), based on the developer.

Of the alkali hydroxides, NaOH and KOH are especially preferred.

Usually the use of alkali metasilicates readily provides a pH value of more than 12 without further alkaline additives such as e.g. alkali hydroxide. When water glass is used, an alkali hydroxide is used in addition if a pH value of more than 12 is desired.

According to one embodiment no silicates are present in the developer.

Preferred quaternary ammonium hydroxides $NR_4OH$ include for example tetramethyl ammonium hydroxide, trimethylethanol ammonium hydroxide, methyltriethanol ammonium hydroxide and mixtures thereof, an especially preferred ammonium hydroxide is tetramethyl ammonium hydroxide.

Suitable amines are primary, secundary and tertiary amines. Examples are mono- and dialkanol amines like monoethanol amine and diethanol amine.

Surfactant

A further optional component of the developer used in the present invention is the surfactant.

The surfactant is not specifically limited as long as it is compatible with the other components of the developer and soluble in aqueous alkaline solutions. The surfactant can be a cationic, an anionic, an amphoteric or a nonionic one.

Examples of anionic surfactants include hydroxyalkanesulfonates, alkylsulfonates, dialkylsulfosuccinates, straight-chain alkylbenzenesulfonates, branched alkylbenzene-sulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, naphthalenesulfonateformalin condensates, sodium dodecylphenoxybenzene disulfonates, the sodium salts of alkylated naphthalenesulfonate, disodium methylene-di-naphtalene-disulfonate, sodium dodecyl-benzenesulfonate, (di)sulfonated alkyldiphenyloxides, ammonium or potassium perfluoroalkylsulfonates and sodium dioctyl-sulfosuccinate.

Particularly preferred among these anionic surfactants are alkylnaphthalenesulfonates, disulfonated alkyldiphenyloxides, and alkylsulfonates.

Suitable examples of the nonionic surfactants include polyoxyethylene alkyl ethers, polyoxyethylene phenyl ethers, polyoxyethylene 2-naphthyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerin-aliphatic acids, aliphatic diethanolamides, N,N-bis-2-hydroxyalkyl amines, polyoxyethylene alkylamines, triethanolaminealiphatic esters, and trialkylamine oxides. Particularly preferred among these nonionic surfactants are polyoxyethylene phenyl ethers and polyoxyethylene-2-naphthyl ethers.

Further, fluorine containing and silicone anionic and nonionic surfactants may be similarly used.

Amphoteric surfactants are for example N-alkylamino acid triethanol ammonium salts, cocamidopropyl betaines, cocamidoalkyl glycinates, sodium salt of a short chain alkylaminocarboxylate, N-2-hydroxyethyl-N-2-carboxyethyl fatty acid amidoethylamin sodium salts, and carboxcylic acid amidoetherpropionates; preferred are cocamidopropylbetaines.

Examples of cationic surfactants are tetraalkyl ammoniumchlorides like tetrabutyl ammoniumchloride and tetramethyl ammoniumchloride, and polypropoxylated quaternary ammonium chlorides.

Nonionic, anionic and amphoteric surfactants as well as mixtures thereof are preferred.

Two or more of the above surfactants may be used in combination. The amount of the surfactant (or total amount of surfactants if more than one is used) is not specifically limited but is preferably from 0.01 to 25 wt-%, more preferably from 2 to 15 wt-% based on the total weight of the developer.

Further Optional Components of the Developer

Besides the essential components and the above-cited optional components the developer used in the present invention may contain further additives like organic solvents, biocides, complexing agents, buffer substances, dyes, antifoaming, agents, odorants, anticorrosive agents and radical inhibitors.

Antifoaming Agents:

Suitable antifoaming agents include e.g. the commercially available Silicone Antifoam Emulsion SE57 (Wacker), TRITON® CF32 (Rohm & Haas), AKYPO® LF (ethercarboxylic acid Chem Y), Agitan 190 (Münzing Chemie), TEGO® Foamese 825 (modified polysiloxane, TEGO Chemie Service GmbH, Germany). Silicone-based antifoaming agents are preferred. They are either dispersible or soluble in water. The amount of antifoaming agent in the developer is preferably 0 to 1 wt-%, based on the weight of the developer especially preferred 0.01 to 0.5 wt-%. One antifoaming agent or a mixture of two or more can be used.

Buffers:

Suitable buffer substances include e.g. tris(hydroxymethyl)-aminomethane (TRIS), hydrogen phosphates, glycine, 3-(cyclohexylamino)-propane sulfonic acid (CAPS), hydrogen carbonates, borates including borax, 2-amino-2-methyl-1-propanol (AMP), 3-(cyclohexylamino)-2-hydroxy-1-propane-sulfonic acid (CAPSO), and 2-(N-cyclohexylamino) ethan-sulfonic acid (CHES).

Biocides:

The biocides should be effective against bacteria, fungi and/or yeasts. Suitable biocides include e.g. N-methylolchloroacetamide, benzoic acid, p-hydroxybenzoic acid esters, phenol or its derivatives, formalin, imidazol derivatives, isothiazolinone derivatives like 1,2-benzisothiazolin-3-on, benzotriazole derivatives, amidines, guanidine derivatives, quaternary ammonium salts, pyridine, quinoline derivatives, diazine, triazole derivatives, oxazole and oxazine derivatives and mixtures thereof. Their amount is not particularly restricted and preferably accounts for 0 to 10 wt-% in the developer, based on the total weight of the solution, especially preferred 0.1 to 1 wt-%. One biocide or a mixture of two or more can be used.

Complexing Agents:

Examples of suitable complexing agents include: Aminopolycarboxylic acid and salts thereof, such as ethylene diamine tetraacetic acid and potassium or sodium salts thereof, diethylene triamine pentaacetic acid and potassium or sodium salts thereof, triethylene tetramino-hexaacetic acid and potassium or sodium salts thereof, hydroxyethyl ethylene diamine triacetic acid and potassium or sodium salts thereof, nitrilotriacetic acid and potassium or sodium salts thereof, 1,2-diaminocyclohexane-tetraacetic acid and potassium or sodium salts thereof and 1,3-diamino-2-propanol-tetraacetic acid and potassium or sodium salts thereof, and an organophosphonic acid, phosphonoalkane tricarboxylic acid or salts thereof, such as 2-phosphonobutane-1,2,4-tricarboxylic acid and potassium or sodium salts thereof, phosphonobutane-2,3,4-tricarboxylic acid and potassium or sodium salts thereof, phosphonoethane-2,2,2-tricarboxylic acid and potassium or sodium salts thereof, aminotris-(methylene-phosphonic acid) and potassium or sodium salts thereof and sodium gluconate. The complexing agents can be used individually or as a combination of two or more. Organic amine salts of the above-mentioned complexing agents can be used instead of the potassium or sodium salts thereof. The amount of complexing agent preferably accounts for 0 to 5 wt-% in the developer, based on the total weight of the solution, especially preferred 0.01 to 1 wt-%.

Organic Solvents:

The developer may also comprise an organic solvent or a mixture of organic solvents. The developer is a single phase. Consequently, the organic solvent must be miscible with water, or at least soluble in the developer to the extent it is added to the developer, so that phase separation does not occur. The following solvents and mixtures of these solvents are suitable for use in the developer: the reaction products of phenol with ethylene oxide and propylene oxide, such as ethylene glycol phenyl ether; benzyl alcohol; esters of ethylene glycol and of propylene glycol with acids having six or fewer carbon atoms, and ethers of ethylene glycol, with alkyl groups having six or fewer carbon atoms, such as 2-ethylethanol and 2-butoxyethanol. A single organic solvent or a mixture of organic solvents can be used. The organic solvent is typically present in the developer at a concentration of between about 0 wt-% to about 15 wt-%, based on the weight of the developer preferably between about 3 wt-% and about 5 wt-%, based on the weight of the developer.

"Sludge Inhibitors":

As described in detail in U.S. Pat. No. 6,383,717 B1 and U.S. Pat. No. 6,482,578 B2 sludge may be formed in a developer bath due to the build up of free-radical polymerizable material in the case of negative working precursors where imaging is based on free-radical polymerization in the coating of the precursor. Sludge formation may be prevented by the presence of at least one material selected from filter dyes and free-radical inhibitors in the developer. Filter dyes absorb ambient ultraviolet and visible radiation and reduce the amount absorbed by the radiation-sensitive initiator system present in the loaded developer. Free-radical inhibitors inhibit free-radical polymerization of the monomer in the loaded developer.

The absorption of the filter dye is matched to the absorption of the radiation-sensitive initiator system, furthermore the filter dye should be stable in the developer and should not undergo any chemical reaction or interaction with the components of the developer, or the radiation-sensitive layer.

The concentration of filter dye required to produce the stabilizing effect under daylight or similar conditions will depend on the number of factors; however, the concentration of the filter dye is preferably about 0 to 2 wt-%, based on the weight of the developer, preferably about 0.4% to 2 wt-%, based on the weight of the developer.

The filter dye must be sufficiently soluble in the developer that enough filter dye can be dissolved in the developer to absorb radiation in the region about 350 nm to about 650 nm region of the spectrum. Dyes substituted with one or more sulfonic acid groups will typically have sufficient solubility in the developer. Preferred dyes include yellowish, yellow, orange and red dyes substituted with sulfonic acid groups. Especially preferred are sulfonated azo dyes. Suitable dyes include, for example, metanil yellow (C.I. 13065) and other similar water-soluble azo dyes, such as, for example, methyl orange (C.I. 13025), tropaeoline O (C.I. 14270), tropaeoline 00 (C.I. 13080), tartrazine (C.I. 19140); Oxonol Yellow K (Riedel-de-Haen); dyes of the acid yellow type, such as C.I. 13900, C.I. 14170, C.I. 18835, C.I. 18965, C.I. 18890, C.I. 18900, C.I. 18950 (polar yellow), C.I. 22910, and C.I. 25135; and dyes of the acid red type, such as C.I. 14710, C.I. 14900, C.I. 17045, C.I. 18050, C.I. 18070, and C.I. 22890. Other suitable dyes will be readily apparent to those skilled in the art. A single filter dye or a mixture of filter dyes can be used.

Suitable free-radical inhibitors, also known as polymer stabilizers or free-radical traps, are well known in the art of monomer and polymer stabilization.

Any material that is capable of reacting with free-radicals to form products that do not initiate polymerization of the monomer, that has the necessary solubility and stability in the developer, and that does not adversely affect the properties of either the developer or the printing plate can potentially be used. They include, for example: compounds containing quinone or hydroquinone moieties, especially benzoquinone and substituted benzoquinones, and hydroquinone and substituted hydroquinones, such as hydroquinone monomethyl ether (4-methoxyphenol), t-butylhydroquinone (4-t-butylphenol, TBHQ), and t-butyl hydroxyanisol (BHA); recorcinol, pyrrogallol, phosphate esters; and hindered phenols and bisphenols, such as 2,6-di-t-butyl-4-methylphenol (BHT), and 2,6-di-t-butyl-4-methoxyphenol, 2,4,6-tri-t-butylphenol; stable free-radicals, such as di-t-butyl nitroxide and 2,2,6,6-tetramethyl-4-pyridone nitroxide; nitro substituted aromatics; amino phenols; phenothiazine; and secondary diaryl amines such as substituted diphenyl amines, N,N'-diphenyl-p-phenylenediamine, and N-phenyl-naphthyl amine. Preferred radical inhibitors are quinones, hydroquinones, ethers of hydroquinones, and hindered phenols. More preferred are ethers of hydroquinones, especially ethers of hydroquinone and hindered phenols. Preferred compounds are hydroquinone monomethyl ether (4-methoxyphenol), 2,6-di-t-butyl-4-methylphenol, and 2,4,6-tri-t-butylphenol. A single free-radical inhibitor or a mixture of free-radical inhibitors can be used. The free-radical inhibitor or a mixture of free-radical inhibitors is typically present in the developer at a concentration of about 0 wt-% to about 3.0 wt-% based on the weight of the developer, preferably about 0.5 wt-% to about 1.5 wt-%, based on the weight of the developer.

Anticorrosive Agents:

Examples of anticorrosive agents are phosphonic acids and their salts like hydroxyethyl phosphonic acid and its salts, amino trismethylene phosphonic acid and its salts, and diethylentriaminpentamethylene phosphonic acid and its salts; phosphates like trisodium phosphate; borates like borax; as well as glycerol and glycols having the formula

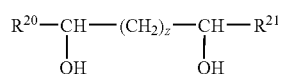

(wherein z is 0, 1 or 2 and $R^{20}$ and $R^{21}$ are independently hydrogen or $C_1$-$C_3$ alkyl).

The anticorrosive agent or mixture of such agents is typically present in the developer at a concentration of about 0 to 10 wt-% based on the weight of the developer, preferably 0.1 to 5 wt-%, in case of glycerol or a glycol 5 to 10 wt-%.

Further Additives:

Odorants and dyes can also be present in the developer, if desired. The dyes are added in order to prevent confusion when different processing chemicals like developer and replenisher are used at the same time at a customer. Examples for classes of dyes that can be used are azo dyes, triarylmethan dyes or phthalocyanines. The concentration of the dyes in the developer is typically 0 to 0.5 wt.-%, preferably 0.0005 to 0.5 wt.-%.

Odorants are used in order to compensate unpleasant smell of other components in the developer. The typical concentration of odorants is within 0 to 1 wt.-%, preferably 0.001 to 1 wt.-%.

The present invention is described in more details in the following examples; however they are not intended to restrict the invention in any way.

EXAMPLES

The following abbreviations are used:
Desmodur® N100 trifunctional isocyanate (biuret of hexamethylene diisocyanate), available from Bayer,
HEMA (2-hydroxyethyl)methacrylate
HEPi 2-(2-hydroxyethyl)-piperidine
HMDI hexamethylene diisocyanate
Joncryl 683 acrylic resin from SC Johnson & Son Inc. USA, acid number=162 mg KOH/g
Kayamer PM-2 ester of 1 mol phosphoric acid and 1.5 mol hydroxyethyl-methacrylate, available from Nippon Kayaku
Renolblue B2G-HW® copper phthalocyanine pigment dispersed in polyvinyl butyral, available from Clariant
TEXAPON® CPS anionic surfactant (sodium octyl sulfate), available from Henkel
Triton H66 anionic polyether phosphate; available from Dow Chemicals
AC 50® methacrylic acid copolymer with an acid number of 48 mg KOH/g; 70 wt % solution in methyl glycol; available from PCAS
Surfynol 2502 nonionic surfactant (ethoxylated/propoxylated 2,4,7,9-tetramethyl-5-decyne-4,7-diol), available from Airproducts Pluriol P 400 polypropylenoxid 430 g/mol (n=4,5,6)
Pluriol P600 polypropylene glycol, $M_w$=600; available from BASF
Pluriol E1500 polypropylene glycol, $M_w$=1500; available from BASF
Basonyl violet 610 Basic Violet 3; C.I. 42555; available from BAyer
Dowanol DPM dipropylene glycol methyl ether
Dowanol EPH ethylene glycol phenyl ether
Dowanol DPnB dipropylene glycol n-butyl ether
Dowanol DPnP dipropylene glycol n-propyl ether
Dowanol TPM tripropylene glycol methyl ether
Dowanol TPnB tripropylene glycol n-butyl ether Examples 1-51 and Comparative Examples 1-9

An electrochemically roughened and anodized aluminum foil with an oxide weight of 3.2 g/m² was subjected to an after treatment using an aqueous solution of polyvinyl phosphoric acid. The average roughness of the surface was 0.55 µm. Coating compositions corresponding to Table 1 (combined with Tables 2 to 5) were applied to the substrate after filtering. The coatings were dried for 4 minutes at 90° C.

The obtained samples were overcoated with an aqueous solution of poly(vinyl alcohol) (Celvol 203 from Air Products, having a hydrolysis degree of 88%) to get a printing plate precursor having a dry coating weight after drying for 4 minutes at 90° C. as shown in Table 1.

TABLE 1

Plates for examples and comparative examples

| plate # | photopolymer layer | coating weight of the photopolymer layer | coating weight of the overcoat layer | exposure step | preheat step |
|---|---|---|---|---|---|
| 1 | Table 2 | 1.5 g/m² | 3 g/m² | 405 nm (30 mW) platesetter ANDROMEDA from Lithotech | 90° C. for 2 min |
| 2 | Table 3 | 1.5 g/m² | 3 g/m² | 405 nm (30 mW) platesetter ANDROMEDA from Lithotech | 90° C. for 2 min |
| 3 | Table 4 | 1.5 g/m² | 3 g/m² | Trendsetter 3244 from Creo (830 nm, 50 to 75 mJ/cm²) | 90° C. for 2 min |
| 4 | Table 5 | 1.5 g/m² | 3 g/m² | Trendsetter 3244 from Creo (830 nm, 50 to 75 mJ/cm²) | 90° C. for 2 min |

TABLE 2

Photosensitive composition 1 for a photopolymer layer sensitized to 405 nm

| | |
|---|---|
| 1.2 g | of a 30% propylen glycol mono methyl ether solution of a terpolymer prepared by polymerization of 470 parts by wt. styrene, 336 parts by wt. methyl methacrylate and 193 parts by wt. methacrylic acid |
| 0.1 g | Kayamer PM-2 (ester of 1 mol phosphoric acid and 1.5 mol hydroxyethylmethacralyte) |
| 0.20 g | mercapto-3-triazol |
| 3.92 g | of a 80% methyl ethyl ketone solution of an urethane acrylate prepared by reacting Desmodur N 100 ® (available from BAYER, Germany) comprising hydroxy ethyl acrylate and pentaerythritol triacrylate having a double-bond content of 0.5 double bonds/100 g when all isocyanate groups are completely reacted with the hydroxy group containing acrylates |
| 0.45 g | ditrimethylolpropane tetraacrylate |
| 1.25 g | of a dispersion in propylen glycol mono methyl ether containing 7.25 wt % of copper phthalocyanine and 7.25 wt % of a polyvinylacetal binder containing 39.9 mol % vinyl alcohol, 1.2 mol % vinylacetate, 15.4 mol % acetal groups from acetaldehyde, 36.1 mol % acetal groups from butyraldchyde and 7.4 acetal groups from 4-formylbenzoic acid |
| 0.7 g | 2-phenyl-4-(2-chlorophenyl)-5-(4-N,N-diethylaminophenyl)-oxazole-1,3 |
| 0.19 g | 2,2-bis-(2-chlorophenyl)-4,5,4',5'-tetraphenyl-2'H-[1,2']biimidazolyl |
| 20 ml | propylene glycol monomethyl ether |
| 16 ml | methanol |
| 25 ml | methyl ethyl keton |

TABLE 3

Photosensitive composition 2 for a photopolymer layer sensitized to 405 nm

| | |
|---|---|
| 0.22 g | Copolymer of 80 mole-% allyl methacrylate and 20 mole-% methacrylic acid with an acid number of 95 mg KOH/1 g |
| 0.1 g | Kayamer PM-2 (1 mole phosphoric acid esterified with 1.5 moles hydroxyethyl methacrylate); available from Coa Corp. Ltd./Japan) |

TABLE 3-continued

Photosensitive composition 2 for a photopolymer layer sensitized to 405 nm

| | | |
|---|---|---|
| 0.31 | g | mercapto-1,2,4-triazole |
| 2.3 | g | of a dispersion in propylene glycol monomethyl ether comprising 21.1 wt.-% copper phthalocyanine and 2.1 wt.-% of a polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 4-formylbenzoic acid |
| 15.25 | g | of a 29.8% monomer solution made by the reaction of 16.82 g hexamethylene diisocyanate, 13.01 g of hydroxyethylmethacrylate, 6.46 g of 2-(2-hydroxyethyl)-piperidine in 85 g methyl ethyl ketone using 0.1 g of dibutyltin dilaurate catalyst |
| 0.7 | g | 2-phenyl-4-(2-chlorophenyl)-5-(4-N,Ndiethylaminophenyl)-oxazole-1,3 |
| 0.17 | g | 2,2-bis-(2-chlorophenyl)-4,5,4',5'-tetraphenyl-2'H-[1,2']biimidazolyl |
| 22.8 | ml | propylene glycol monomethyl ether |
| 16.3 | ml | methanol |
| 26 | ml | methyl ethyl ketone |
| 0.22 | g | Copolymer of 80 mole-% allyl methacrylate and 20 mole-% methacrylic acid with an acid number of 95 mg KOH/1 g |

TABLE 4

Photosensitive composition 3 for a photopolymer layer sensitized to 810 . . . 830 nm

| | | |
|---|---|---|
| 3.0 | g | Ionacryl 683 ® (acrylic acid copolymer available from SC Johnson &Son Inc, having an acid number of 180 mg KOH/g) |
| 4.4 | g | AC 50 ® (methacrylic acid copolymer available from PCAS having an acid number of 48 mg KOH/g, 70 wt.-% solution in methyl glycol) |
| 8.4 | g | of a 80% methyl ethyl ketone solution of a urethane acrylate prepared by reacting 1-methyl-2,4-bis-isocyanate benzene (Desmodur N100 ® available from Bayer) with hydroxy ethyl acetate and pentaerythritol triacrylate having a double-bond content of 0.50 double bonds/100 g when all isocyanate groups are completely reacted |
| 1.4 | g | dipentaerythritol pentaacrylate |
| 0.75 | g | 2-(4-methoxyphenyl)-4,6-bis(trichlormethyl)-s-triazine |
| 0.3 | g | Renol Blue B2G HW ® (copper phthalocyanine pigment preparation with polyvinyl butyral available from Clariant) |
| 0.4 | g | anilino diacetic acid |
| 0.25 | g | 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indoliumchloride |
| 100 | ml | solvent comprising 30 parts by volume methyl glycol, 45 parts by volume methanol, 25 parts by volume methyl ethyl ketone |

TABLE 5

Photosensitive composition 4 for a photopolymer layer sensitized to 810 . . . 830 nm

| | | |
|---|---|---|
| 6.3 | g | JONCRYL ® 683 (acrylic acid copolymer of the company SC Johnson, USA; acid number = 175 mg KOH/g) |
| 9.0 | g | AC 50 ® (methacrylic acid copolymer of the company PCAS, France; acid number = 48 mg KOH/g; 70 wt.-% solution in ethylene glycol monomethyl ether) |
| 1.4 | g | dipentaerythritol pentaacrylate |
| 16.8 | g | urethane acrylate (80% solution in methyl ethyl ketone; prepared by reacting Desmodur ® N100 of the company Bayer with hydroxyethyl acrylate and pentaerythritol triacrylate; amount of double bonds: 0.5 double bonds per 100 g, when all isocyanate groups have reacted) |
| 1.8 | g | 2-(4-ethenyl)benzyl-5-mercapto-1,3,4-thiadiazol |
| 0.45 | g | 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H indoliumchloride |
| 2.5 | g | 2-(4-methoxyphenyl)-4,6-bis(trichloromethyl)-1,3,5-triazine and |
| 0.4 | g | BASONYL VIOLET 610 (Basic Violet 3, C.I. 42555; available from Bayer, Germany) |

After exposure and preheat step the plates were developed. The components of the tested developers and comparative developers are shown in Table 6.

In Table 6 also the results of a "soak loss test" are given which was carried out as follows:

For the determination of the soak loss of a negative plate, the plate (without overcoat) was subjected to overall exposure. A disc with 1 $dm^2$ have been stamped out and the weight thereof has been determined ($W_{EnD}$). Afterwards the disc has been treated with the developer (dwell time: 1 minute; temperature: 21° C.) and after drying the weight has been determined again ($W_{ED}$).

The soak loss in % was calculated according to the following equation:

$$\text{soak loss } [\%] = \frac{W_{EnD} - W_{ED}}{CW} \times 100$$

with
CW=coating weight
$W_{EnD}$=weight of the exposed, not developed disc
$W_{ED}$=weight of the exposed and developed disc From the soak loss results obtained with developer D1 and comparative developers CD1 and CD4 (see Table 6) it is apparent that an increase of the amount of Dowanol EPH by 3 wt-% results in a higher soak loss (comparison of CD1 and CD4) while the addition of 3 wt-% of a derivative of Formula (A) like Pluriol P600 surprisingly results in a lower soak loss.

TABLE 6

Composition of the used developers and soak losses

| developer | developer components/pH | amount of components | soak loss plate 1 | plate 2 | plate 3 | plate 4 |
|---|---|---|---|---|---|---|
| CD1 (comparative developer) | water | 82.645 wt-% | 0.73 g/m² | 0.69 g/m² | 0.68 g/m² | — |
| | KOH solution (45 wt-%) | 0.492 wt-% | | | | |
| | TEXAPON CPS | 10.99 wt-% | | | | |
| | DOWANOL EPH | 5.873 wt-% | | | | |
| developer D1 | water | 79.645 wt-% | 0.51 g/m² | 0.47 g/m² | 0.44 g/m² | — |
| | KOH solution (45 wt-%) | 0.492 wt-% | | | | |
| | TEXAPON CPS | 10.99 wt-% | | | | |
| | DOWANOL EPH | 5.873 wt-% | | | | |
| | Pluriol P 600 | 3 wt-% | | | | |
| developer D2 | water | 57.645 wt-% | 0.21 g/m² | 0.39 g/m² | 0.35 g/m² | — |
| | KOH solution (45 wt-%) | 0.492 wt-% | | | | |
| | TEXAPON CPS | 10.99 wt-% | | | | |
| | DOWANOL EPH | 5.873 wt-% | | | | |
| | Dowanol DPM | 25 wt-% | | | | |
| developer D3 | water | 82.145 wt-% | 0.38 g/m² | 0.32 g/m² | 0.35 g/m² | — |
| | KOH solution (45 wt-%) | 0.492 wt-% | | | | |
| | TEXAPON CPS | 10.99 wt-% | | | | |
| | DOWANOL EPH | 5.873 wt-% | | | | |
| | Pluriol E 1500 | 0.5 wt-% | | | | |
| developer D4 | water | 77.635 wt-% | 0.34 g/m² | 0.41 g/m² | 0.37 g/m² | — |
| | KOH solution (45 wt-%) | 0.365 wt-% | | | | |
| | TEXAPON CPS | 10 wt-% | | | | |
| | DOWANOL EPH | 5 wt-% | | | | |
| | Dowanol DPnB | 7 wt-% | | | | |
| developer D5 | water | 78.5 wt-% | 0.41 g/m² | 0.36 g/m² | 0.38 g/m² | — |
| | KOH solution (45 wt-%) | 0.5 wt-% | | | | |
| | TEXAPON CPS | 7 wt-% | | | | |
| | DOWANOL EPH | 6 wt-% | | | | |
| | Dowanol DPnP | 8 wt-% | | | | |
| developer D6 | water | 85.217 wt-% | 0.49 g/m² | 0.47 g/m² | 0.43 g/m² | — |
| | KOH solution (45 wt-%) | 0.783 wt-% | | | | |
| | TEXAPON CPS | 7 wt-% | | | | |
| | DOWANOL EPH | 4 wt-% | | | | |
| | DIPROPYLENE GLYCOL | 3 wt-% | | | | |
| developer D7 | water | 68.531 wt-% | 0.32 g/m² | 0.24 g/m² | 0.26 g/m² | — |
| | KOH solution (45 wt-%) | 0.469 wt-% | | | | |
| | TEXAPON CPS | 15 wt-% | | | | |
| | DOWANOL EPH | 10 wt-% | | | | |
| | Dowanol TPM | 6 wt-% | | | | |
| developer D8 | water | 72.528 wt-% | 0.21 g/m² | 0.19 g/m² | 0.19 g/m² | — |
| | KOH solution (45 wt-%) | 0.472 wt-% | | | | |
| | TEXAPON CPS | 3 wt-% | | | | |
| | DOWANOL EPH | 9 wt-% | | | | |
| | Dowanol TPnB | 15 wt-% | | | | |
| developer D9 | water | 87.631 wt-% | 0.35 g/m² | 0.33 g/m² | 0.31 g/m² | — |
| | KOH solution (45 wt-%) | 0.369 wt-% | | | | |
| | TEXAPON CPS | 7 wt-% | | | | |
| | DOWANOL EPH | 3 wt-% | | | | |
| | Tripropylene glycol monoethyl ether | 2 wt-% | | | | |

TABLE 6-continued

Composition of the used developers and soak losses

| developer | developer components/pH | amount of components | soak loss plate 1 | plate 2 | plate 3 | plate 4 |
|---|---|---|---|---|---|---|
| developer D10 | water | 64.057 wt-% | 0.28 g/m² | 0.26 g/m² | 0.29 g/m² | — |
| | KOH solution (45 wt-%) | 0.943 wt-% | | | | |
| | TEXAPON CPS | 1 wt-% | | | | |
| | DOWANOL EPH | 13 wt-% | | | | |
| | Tripropylene Glycol | 21 wt-% | | | | |
| developer D11 | water | 76.208 wt-% | 0.36 g/m² | 0.37 g/m² | 0.24 g/m² | — |
| | KOH solution (45 wt-%) | 0.792 wt-% | | | | |
| | TEXAPON CPS | 12 wt-% | | | | |
| | DOWANOL EPH | 7 wt-% | | | | |
| | Pluriol P 400 | 4 wt-% | | | | |
| developer D12 | water | 82.145 wt-% | 0.38 g/m² | 0.32 g/m² | 0.35 g/m² | — |
| | KOH solution (45 wt-%) | 0.492 wt-% | | | | |
| | TEXAPON CPS | 10.99 wt-% | | | | |
| | DOWANOL EPH | 5.873 wt-% | | | | |
| | Pluriol E 1500 | 0.5 wt-% | | | | |
| CD 2 (comparative developer) | Water | 94.84 wt-% | 0.87 g/m² | — | 0.81 g/m² | 1.08 g/m² |
| | KOH solution (45 wt-%) | 0.169 wt-% | | | | |
| | Surfynol 2502 | 4.991 wt-% | | | | |
| developer D13 | Water | 91.84 wt-% | 0.72 g/m² | — | 0.43 g/m² | 0.68 g/m² |
| | KOH solution (45 wt-%) | 0.169 wt-% | | | | |
| | Surfynol 2502 | 4.991 wt-% | | | | |
| | Pluriol P 600 | 3 wt-% | | | | |
| developer D14 | Water | 69.84 wt-% | 0.39 g/m² | — | 0.27 g/m² | 0.39 g/m² |
| | KOH solution (45 wt-%) | 0.169 wt-% | | | | |
| | Surfynol 2502 | 4.991 wt-% | | | | |
| | Dowanol DPM | 25 wt-% | | | | |
| developer D15 | Water | 94.34 wt-% | 0.38 g/m² | — | 0.41 g/m² | 0.49 g/m² |
| | KOH solution (45 wt-%) | 0.169 wt-% | | | | |
| | Surfynol 2502 | 4.991 wt-% | | | | |
| | Pluriol E 1500 | 0.5 wt-% | | | | |
| CD 3 (comparative developer) | water | 89.958 wt-% | 0.83 g/m² | — | 0.79 g/m² | 0.68 g/m² |
| | KOH solution (45 wt-%) | 0.531 wt-% | | | | |
| | Surfynol 2502 | 4.733 wt-% | | | | |
| | Triton H66 | 4.778 wt-% | | | | |
| developer D16 | water | 86.958 wt-% | 0.46 g/m² | — | 0.43 g/m² | 0.49 g/m² |
| | KOH solution (45 wt-%) | 0.531 wt-% | | | | |
| | Surfynol 2502 | 4.733 wt-% | | | | |
| | Triton H66 | 4.778 wt-% | | | | |
| | Pluriol P 600 | 3 wt-% | | | | |
| developer D17 | water | 64.958 wt-% | 0.38 g/m² | — | 0.32 g/m² | 0.31 g/m² |
| | KOH solution (45 wt-%) | 0.531 wt-% | | | | |
| | Surfynol 2502 | 4.733 wt-% | | | | |
| | Triton H66 | 4.778 wt-% | | | | |
| | Dowanol DPM | 25 wt-% | | | | |
| developer D18 | water | 89.458 wt-% | 0.38 g/m² | — | 0.41 g/m² | 0.37 g/m² |
| | KOH solution (45 wt-%) | 0.531 wt-% | | | | |
| | Surfynol 2502 | 4.733 wt-% | | | | |
| | Triton H66 | 4.778 wt-% | | | | |
| | Pluriol E 1500 | 0.5 wt-% | | | | |
| CD 4 (comparative developer) | water | 79.645 wt-% | 1.20 g/m² | 1.19 g/m² | 1.07 g/m² | — |
| | KOH solution (45-wt %) | 0.492 wt-% | | | | |
| | TEXAPON CPS | 10.99 wt-% | | | | |
| | Dowanol EPH | 8.873 wt-% | | | | |

Printing with the Plates:

The thus prepared plates were loaded in a sheet-fed offset printing machine using an abrasive ink (Offset S 7184 available from Sun Chemical which contains 10% of calcium carbonate).

The image free areas were checked for toning. Up to 20 000 copies were made but, unless noted otherwise, the print run could have continued.

The following tests were carried out in order to check whether the use of developers D1-D18 results in any improvement compared to the comparative developers (CD1-CD3). The results of these tests are summarized in Table 7.

Evaluation of the Developing Speed:

For assessment of the developability unexposed plate stripes of 5×30 cm² were dipped into the corresponding developer being placed in a glass beaker and every 5 sec the stripes were lowered 4 cm deeper into the developer. Prior to this, the plates were treated for 2 min in an oven at 90° C. After 50 sec the stripes were taken out of the developer, rinsed with water and the time to get the first clean step was noted as the developing time. The results are summarized in Table 7.

Sludge Formation:

For evaluation of the sludge formation during the development process the following procedure was used. A processor Raptor Polymer HW from Glunz & Jensen allowing the steps of preheating the plates (110° C. measured on plate back site), washing off the overcoat with tap water, developing the plate supported by two brushes at 23° C. for 20 sec, rinsing the developed plate with tap water and gumming the plate with gum 850S from Kodak Polychrome Graphics was filled with the corresponding developer bath. The developer was drained out of the processor and was accessed with respect to remaining sludge in the processor and easiness of cleaning with spraying of water.

Test for Scumming:

For the preparation of a lithographic plate a printing layer is applied to the aluminum foil, as explained above, exposed, heated, developed and after rinsing with water the developed plate is wiped and rubbed with an aqueous solution of 0.5% phosphoric acid and 6% gum arabic. The thus prepared plate is loaded in a sheet-fed offset printing machine using an abrasive ink (Offset S 7184 available from Sun Chemical which contains 10% of calcium carbonate). The image free areas were checked for scumming after 50 copies until printing was stopped.

Dot Sharpening:

Dot sharpening is understood by the expert as an enhancement of dot loss during the press operation. It is defined as the relative dot loss (dot_loss) of a linearized plate. It is determined from the difference of the integrals for the dot gain (dot_gain=measured tonal value−desired tonal value) before and after press test that are integrated over all tonal values TW (Equation 1).

$$\text{dot\_loss} = \int_0^{100} [\text{dot\_gain}]_{before\_press} dTW - \int_0^{100} [\text{dot\_gain}]_{after\_press} dTW \quad (1)$$

Thus, the smaller the dot loss the better the plate for our applications. The relative dot loss is calculated by dividing the dot loss of the sample by the dot loss of the reference multiplied with 100, (see Eq. 2.). For determining the dot loss reference value a sample of the same plate was treated with the commercial developer Kodak 980.

$$\text{relative\_dot\_loss} = \frac{\text{dot\_loss(sample)}}{\text{dot\_loss(reference\_sample)}} \cdot 100 \quad (2)$$

The results for different plates developed with different developers are summarized in Table 7.

TABLE 7

| Example | Plate | Developer | Exposure | Developability | Sludge formation in the processor | Dot Sharpening on Press | Tendency to scum on press |
|---|---|---|---|---|---|---|---|
| Comp. Example 1 | 1 | CD1 | 405 nm/40 μJ/cm² | 5 sec | Yes | 72 | no |
| Comp. Example 2 | 2 | CD1 | 405 nm/70 μJ/cm² | 5 sec | Yes | 63 | no |
| Comp. Example 3 | 3 | CD1 | 830 nm/60 μJ/cm² | 5 sec | Yes | 59 | no |
| Example 1 | 1 | D1 | 405 nm/80 μJ/cm² | 5 sec | No | 85 | no |
| Example 2 | 2 | D1 | 405 nm/50 μJ/cm² | 5 sec | No | 55 | no |
| Example 3 | 3 | D1 | 830 nm/100 μJ/cm² | 5 sec | No | 95 | no |
| Example 4 | 1 | D2 | 405 nm/75 μJ/cm² | 5 sec | No | 67 | no |
| Example 5 | 2 | D2 | 405 nm/60 μJ/cm² | 5 sec | No | 53 | no |
| Example 6 | 3 | D2 | 830 nm/70 μJ/cm² | 5 sec | No | 61 | no |
| Example 7 | 1 | D3 | 405 nm/40 μJ/cm² | 5 sec | No | 88 | no |
| Example 8 | 2 | D3 | 405 nm/60 μJ/cm² | 5 sec | No | 51 | no |
| Example 9 | 3 | D3 | 830 nm/50 μJ/cm² | 5 sec | No | 78 | no |
| Example 10 | 1 | D4 | 405 nm/40 μJ/cm² | 5 sec | No | 63 | no |
| Example 11 | 2 | D4 | 405 nm/60 μJ/cm² | 5 sec | No | 65 | no |
| Example 12 | 3 | D4 | 830 nm/50 μJ/cm² | 5 sec | No | 78 | no |
| Example 13 | 1 | D5 | 405 nm/40 μJ/cm² | 5 sec | No | 83 | no |
| Example 14 | 2 | D5 | 405 nm/60 μJ/cm² | 5 sec | No | 84 | no |
| Example 15 | 3 | D5 | 830 nm/50 μJ/cm² | 5 sec | No | 91 | no |
| Example 16 | 1 | D6 | 405 nm/40 μJ/cm² | 5 sec | No | 76 | no |
| Example 17 | 2 | D6 | 405 nm/60 μJ/cm² | 5 sec | No | 84 | no |
| Example 18 | 3 | D6 | 830 nm/50 μJ/cm² | 5 sec | No | 75 | no |
| Example 19 | 1 | D7 | 405 nm/40 μJ/cm² | 5 sec | No | 71 | no |
| Example 20 | 2 | D7 | 405 nm/60 μJ/cm² | 5 sec | No | 75 | no |
| Example 21 | 3 | D7 | 830 nm/50 μJ/cm² | 5 sec | No | 79 | no |
| Example 22 | 1 | D8 | 405 nm/40 μJ/cm² | 5 sec | No | 85 | no |
| Example 23 | 2 | D8 | 405 nm/60 μJ/cm² | 5 sec | No | 94 | no |
| Example 24 | 3 | D8 | 830 nm/50 μJ/cm² | 5 sec | No | 83 | no |
| Example 25 | 1 | D9 | 405 nm/40 μJ/cm² | 5 sec | No | 86 | no |
| Example 26 | 2 | D9 | 405 nm/60 μJ/cm² | 5 sec | No | 91 | no |
| Example 27 | 3 | D9 | 830 nm/50 μJ/cm² | 5 sec | No | 71 | no |
| Example 28 | 1 | D10 | 405 nm/40 μJ/cm² | 5 sec | No | 76 | no |

TABLE 7-continued

| Example | Plate | Developer | Exposure | Developability | Sludge formation in the processor | Dot Sharpening on Press | Tendency to scum on press |
|---|---|---|---|---|---|---|---|
| Example 29 | 2 | D10 | 405 nm/60 µJ/cm² | 5 sec | No | 77 | no |
| Example 30 | 3 | D10 | 830 nm/50 µJ/cm² | 5 sec | No | 74 | no |
| Example 31 | 1 | D11 | 405 nm/40 µJ/cm² | 5 sec | No | 81 | no |
| Example 32 | 2 | D11 | 405 nm/60 µJ/cm² | 5 sec | No | 73 | no |
| Example 33 | 3 | D11 | 830 nm/50 µJ/cm² | 5 sec | No | 74 | no |
| Comp. Example 4 | 1 | CD2 | 405 nm/60 µJ/cm² | 5 sec | Yes | 50 | no |
| Comp. Example 5 | 3 | CD2 | 830 nm/70 mJ/cm² | 5 sec | Yes | 78 | no |
| Comp. Example 6 | 4 | CD2 | 830 nm/70 mJ/cm² | 5 sec | Yes | 71 | no |
| Example 34 | 1 | D13 | 405 nm/40 µJ/cm² | 5 sec | No | 88 | no |
| Example 35 | 3 | D13 | 830 nm/65 mJ/cm² | 5 sec | Yes | 87 | no |
| Example 36 | 4 | D13 | 830 nm/50 mJ/cm² | 5 sec | Yes | 76 | no |
| Example 37 | 1 | D14 | 405 nm/55 mJ/cm² | 5 sec | No | 79 | no |
| Example 38 | 3 | D14 | 405 nm/45 mJ/cm² | 5 sec | No | 92 | no |
| Example 39 | 4 | D14 | 830 nm/80 mJ/cm² | 5 sec | No | 85 | no |
| Example 40 | 1 | D15 | 405 nm/45 mJ/cm² | 5 sec | No | 78 | no |
| Example 41 | 3 | D15 | 405 nm/60 mJ/cm² | 5 sec | No | 41 | no |
| Example 42 | 4 | D15 | 830 nm/80 mJ/cm² | 5 sec | No | 59 | no |
| Comp. Example 7 | 1 | CD3 | 405 nm/85 mJ/cm² | 5 sec | Yes | 73 | no |
| Comp. Example 8 | 3 | CD3 | 405 nm/50 mJ/cm² | 5 sec | Yes | 79 | no |
| Comp. Example 9 | 4 | CD3 | 830 nm/60 mJ/cm² | 5 sec | Yes | 67 | no |
| Example 43 | 1 | D16 | 405 nm/65 mJ/cm² | 5 sec | No | 80 | no |
| Example 44 | 3 | D16 | 405 nm/80 mJ/cm² | 5 sec | No | 85 | no |
| Example 45 | 4 | D16 | 830 nm/75 mJ/cm² | 5 sec | No | 89 | no |
| Example 46 | 1 | D17 | 405 nm/90 mJ/cm² | 5 sec | No | 70 | no |
| Example 47 | 3 | D17 | 405 nm/60 mJ/cm² | 5 sec | No | 65 | no |
| Example 48 | 4 | D17 | 830 nm/80 mJ/cm² | 5 sec | No | 77 | no |
| Example 49 | 1 | D18 | 405 nm/75 mJ/cm² | 5 sec | No | 58 | no |
| Example 50 | 3 | D18 | 405 nm/50 mJ/cm² | 5 sec | No | 47 | no |
| Example 51 | 4 | D18 | 830 nm/60 mJ/cm² | 5 sec | No | 48 | no |

The examples show that plates developed according to this invention show less attack of the image parts by the developer leading to a low soak loss and less sludge formation in the processor. At the same time the developability is not affected and no tendency to scumming was observed.

The invention claimed is:

1. Method of producing an imaged lithographic printing plate comprising:
   (a) providing a negative working radiation sensitive lithographic plate precursor for wet offset printing comprising on a substrate at least one photosensitive layer based on radical photopolymerization and optionally an oxygen-impermeable overcoat,
   (b) imagewise exposing the precursor with radiation having a wavelengths from 250 to 1200 nm, and
   (c) developing the exposed precursor with an aqueous silicate-free, alkaline developer comprising:
      (i) at least one alkylene oxide derivate of formula (A)

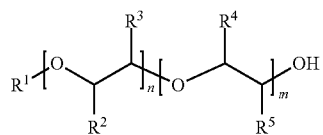

(A)

wherein $R^1$ is a linear or branched C1 to C6 alkyl group or H, (n+m) is an integer from 2 to 30, and $R^2$, $R^3$, $R^4$ and $R^5$ are each independently selected from H, methyl and ethyl, with the proviso that at least one of $R^2$ and $R^3$ is not H, and with the further proviso that at least one of $R^4$ and $R^5$ is not H;
      (ii) at least one component selected from alkaline components and surfactants and
      (iii) optionally at least one of complexing agents, buffers, defoamers, organic solvents, dyes, odorants, biocides, anticorrosive agents, dispersing agents and thickeners and wherein the developer has a pH of 8 to 13.

2. Method according to claim 1, wherein the radiation-sensitive coating is sensitive to radiation of a wavelength selected from the range of 250 to 750 nm and imagewise exposure was carried out with radiation of a wavelength selected from the range of 250 to 750 nm.

3. Method according to claim 1, wherein the radiation-sensitive coating is sensitive to radiation of a wavelength selected from the range of more than 750 to 1200 nm and the imagewise exposure was carried out with radiation of a wavelength selected from the range of more than 750 to 1200 nm.

4. Method according to claim 1 wherein (n+m) in formula (A) is an integer from 2 to 9.

5. Method according to claim 1 wherein in formula (A) $R^1$ is H, —CH$_3$ or —CH$_2$—CH$_3$.

6. Method according to claim 1 wherein the alkylene oxide derivate is selected from polypropylene oxide having a molecular weight wherein (n+m)=2 to 30, dipropylene glycol methyl ether, dipropylene glycol n-propyl ether, dipropylene glycol n-butyl ether, dipropylene glycol, tripropylene glycol methyl ether, tripropylene glycol n-butyl ether, tripropylene glycol monoethyl ether, and tripropylene glycol.

7. Method according to claim 1 to wherein the alkylene oxide derivative is present in the developer in an amount of 0.001 to 50 wt. %.

8. Method according to claim 1 wherein the developer comprises a surfactant.

9. Method according to claim 1 wherein the developer comprises an alkaline reagent.

10. Method according to claim 1 wherein the precursor comprises an overcoat which is optionally removed before step (c).

11. Method according to claim 1 wherein the method further comprises a preheat step after step (b) and before step (c).

* * * * *